United States Patent
Coakley et al.

(10) Patent No.: US 10,446,956 B2
(45) Date of Patent: Oct. 15, 2019

(54) FLEXIBLE CIRCUITS FOR ELECTRICAL HARNESSES

(71) Applicant: CelLink Corporation, San Carlos, CA (US)

(72) Inventors: Kevin Michael Coakley, Belmont, CA (US); Malcolm Brown, Mountain View, CA (US); Jose Juarez, Mountain View, CA (US); Dongao Yang, Redwood City, CA (US)

(73) Assignee: CELLINK CORPORATION, San Carlos, CA (US)

( * ) Notice: Subject to any disclaimer, the term of this patent is extended or adjusted under 35 U.S.C. 154(b) by 0 days.

(21) Appl. No.: 16/371,708

(22) Filed: Apr. 1, 2019

(65) Prior Publication Data

US 2019/0229449 A1    Jul. 25, 2019

Related U.S. Application Data

(63) Continuation of application No. 16/164,722, filed on Oct. 18, 2018, which is a continuation of application
(Continued)

(51) Int. Cl.
*H01B 7/04* (2006.01)
*H01R 12/59* (2011.01)
(Continued)

(52) U.S. Cl.
CPC .......... *H01R 12/592* (2013.01); *B60J 5/0413* (2013.01); *B60R 16/0215* (2013.01);
(Continued)

(58) Field of Classification Search
CPC .......... H01B 7/04; H01B 7/0045; H01B 7/08; H01B 13/01254; H05K 1/028; H01R 2201/26; B60R 16/0215
(Continued)

(56) References Cited

U.S. PATENT DOCUMENTS

| 4,030,799 A | | 6/1977 | Venaleck |
| 4,065,199 A | * | 12/1977 | Andre ...................... H01B 7/08 174/72 A |

(Continued)

FOREIGN PATENT DOCUMENTS

| CN | 203157898 U | 8/2013 |
| JP | 2003203699 A | 7/2003 |

(Continued)

OTHER PUBLICATIONS

"U.S. Appl. No. 15/952,773, Notice of Allowance dated Jul. 19, 2018", 17 pages.
(Continued)

*Primary Examiner* — Sherman Ng
(74) *Attorney, Agent, or Firm* — Kwan & Olynick LLP

(57) ABSTRACT

Provided are electrical harness assemblies and methods of forming such harness assemblies. A harness assembly comprises a conductor trace, comprising a conductor lead with a width-to-thickness ratio of at least 2. This ratio provides for a lower thickness profile and enhances heat transfer from the harness to the environment. In some examples, a conductor trace may be formed from a thin sheet of metal. The same sheet may be used to form other components of the harness. The conductor trace also comprises a connecting end, monolithic with the conductor lead. The width-to-thickness ratio of the connecting end may be less than that of the conductor trace, allowing for the connecting end to be directly mechanically and electrically connected to a connector of the harness assembly. The connecting end may be folded, shaped, slit-rearranged, and the like to reduce its width-to-thickness ratio, which may be close to 1.

18 Claims, 23 Drawing Sheets

Related U.S. Application Data

No. 15/952,773, filed on Apr. 13, 2018, now Pat. No. 10,153,570.

(60) Provisional application No. 62/616,567, filed on Jan. 12, 2018, provisional application No. 62/485,544, filed on Apr. 14, 2017.

(51) Int. Cl.

| | | |
|---|---|---|
| *H01B 7/08* | (2006.01) | |
| *H05K 1/02* | (2006.01) | |
| *B60J 5/04* | (2006.01) | |
| *B60R 16/02* | (2006.01) | |
| *H01B 7/00* | (2006.01) | |
| *H01R 43/20* | (2006.01) | |
| *H01R 12/69* | (2011.01) | |
| *H01B 7/42* | (2006.01) | |
| *H01B 13/012* | (2006.01) | |

(52) U.S. Cl.
CPC ............ *H01B 7/0045* (2013.01); *H01B 7/04* (2013.01); *H01B 7/08* (2013.01); *H01R 12/69* (2013.01); *H01R 43/205* (2013.01); *H05K 1/0201* (2013.01); *H05K 1/028* (2013.01); *B60Y 2410/115* (2013.01); *H01B 7/421* (2013.01); *H01B 13/01254* (2013.01); *H01R 2201/26* (2013.01); *H05K 2201/052* (2013.01)

(58) Field of Classification Search
USPC ............................................ 174/72 A, 117 F
See application file for complete search history.

(56) References Cited

U.S. PATENT DOCUMENTS

| | | | |
|---|---|---|---|
| 5,406,530 A | 10/1995 | Toba et al. | |
| 5,993,247 A | 11/1999 | Kidd | |
| 6,152,763 A | 11/2000 | Sai | |
| 6,309,241 B2* | 10/2001 | Nagai | H01R 12/68 439/422 |
| 6,669,501 B2 | 12/2003 | Serizawa et al. | |
| 2001/0009067 A1* | 7/2001 | Nagai | H01R 12/68 29/866 |
| 2008/0128165 A1 | 6/2008 | Bardella et al. | |
| 2009/0015976 A1 | 1/2009 | Hara et al. | |
| 2010/0221949 A1 | 9/2010 | Okamoto | |
| 2011/0290397 A1 | 12/2011 | Rodriguez et al. | |
| 2014/0091655 A1 | 4/2014 | Kajita et al. | |
| 2014/0235117 A1 | 8/2014 | Sato | |
| 2015/0203058 A1 | 7/2015 | Osada et al. | |
| 2015/0329069 A1 | 11/2015 | Daugherty et al. | |

FOREIGN PATENT DOCUMENTS

| | | |
|---|---|---|
| JP | 2004127741 A | 4/2004 |
| WO | 2018175599 A1 | 9/2018 |
| WO | 2018191633 A1 | 10/2018 |

OTHER PUBLICATIONS

"U.S. Appl. No. 16/164,722, Notice of Allowance dated Jan. 17, 2017", 14 pages.

"Int'l Application Serial No. PCT/US18/23586, Notification of Transmittal of Int'l Search Report and Written Opinion dated Jul. 23, 2018", 15 pgs.

"Int'l Application Serial No. PCT/US18/27512, Int'l Search Report and Written Opinion dated Aug. 2, 2018", 13 pgs.

\* cited by examiner

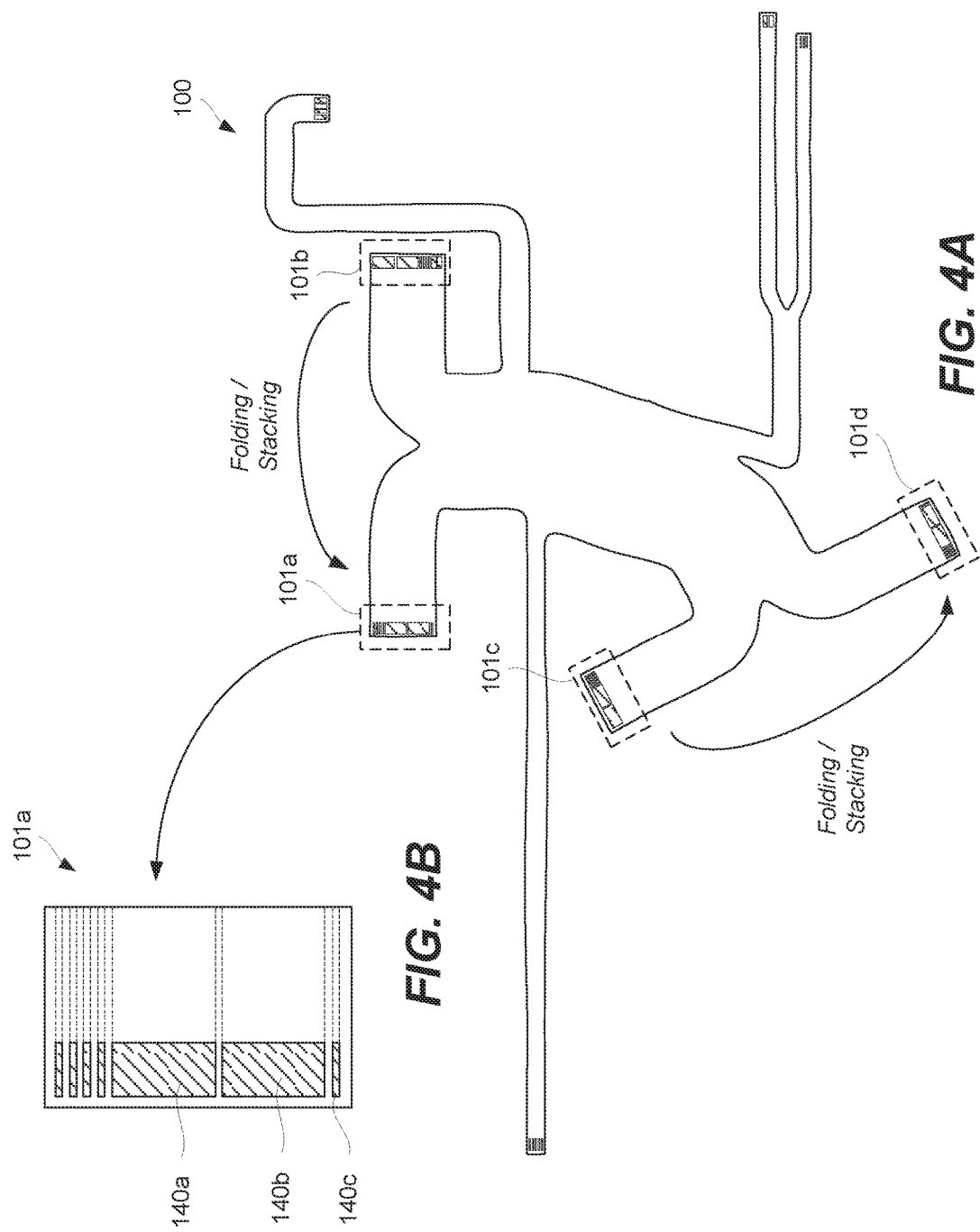

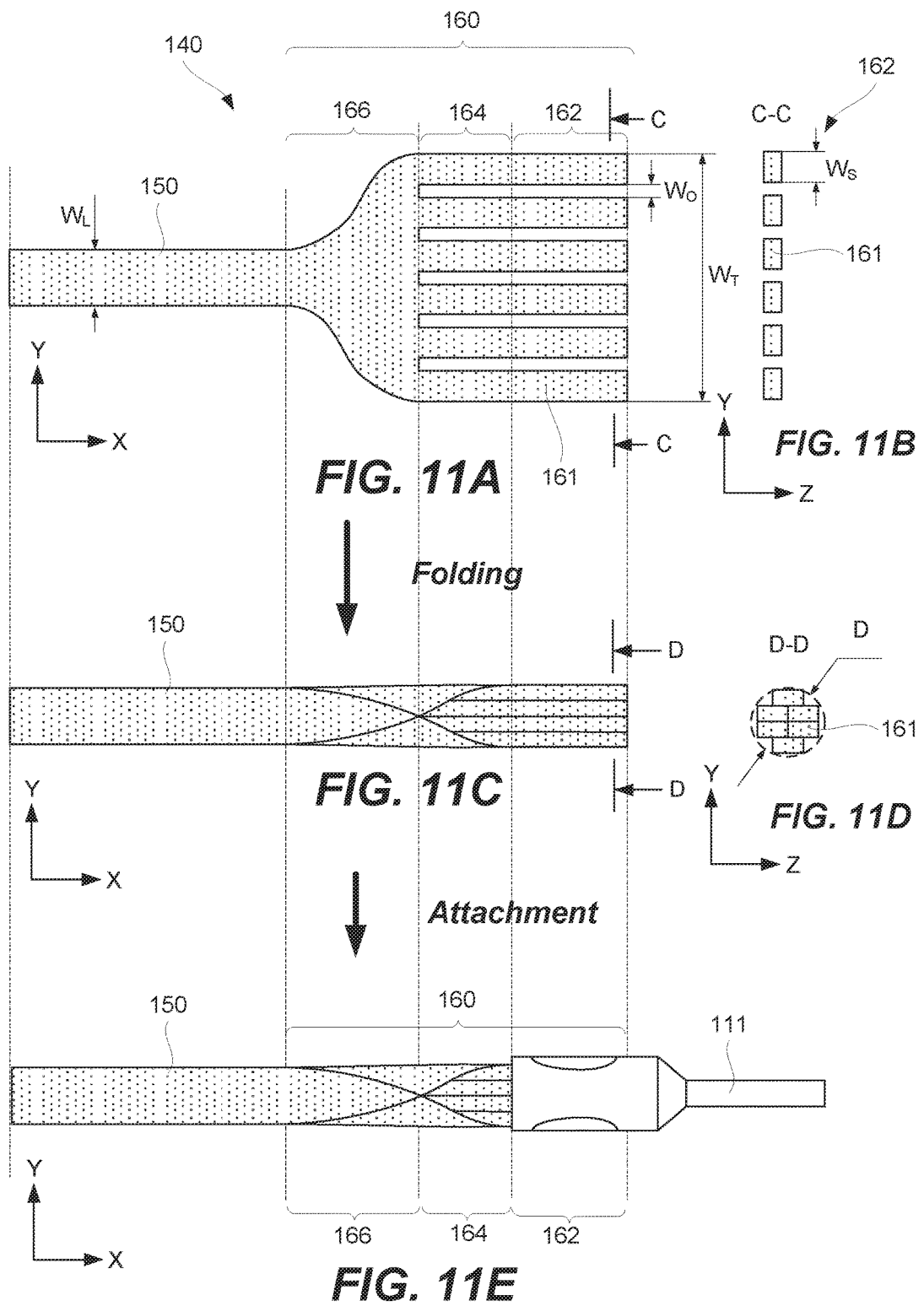

Additional Folding of Conductor Traces

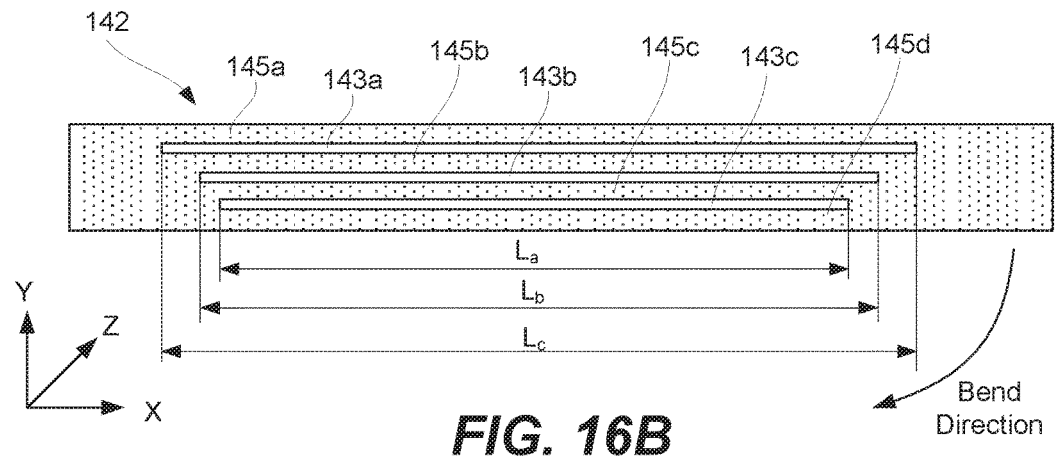
FIG. 16B
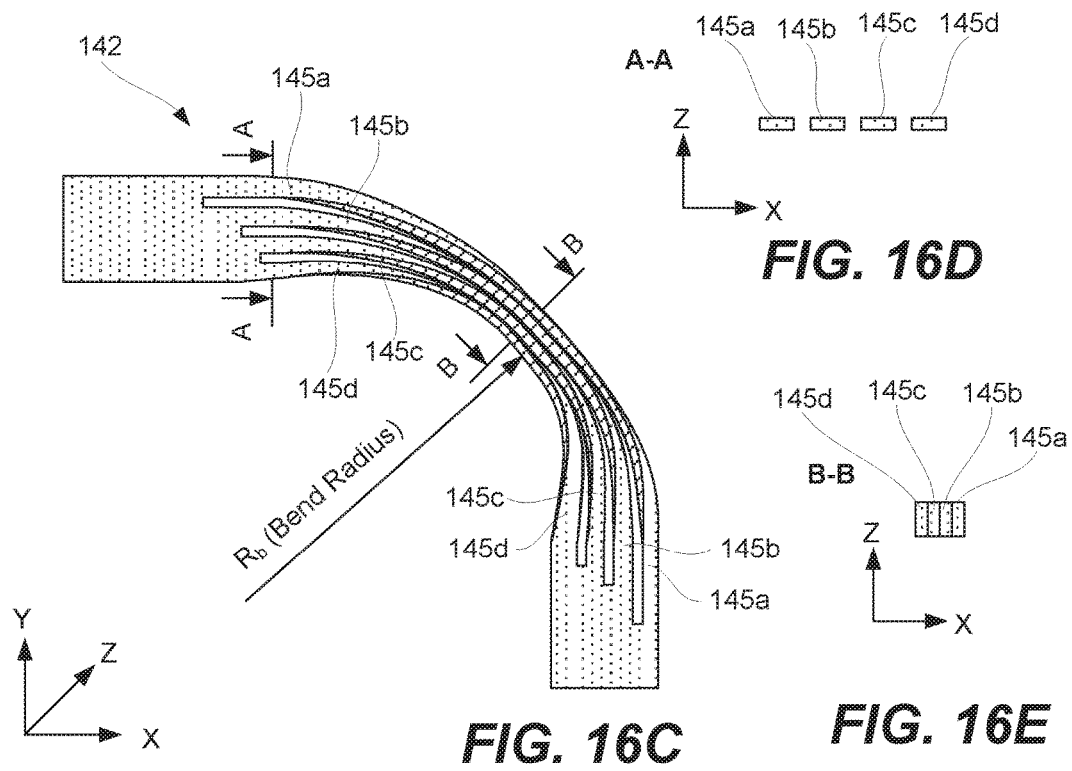
FIG. 16C
FIG. 16D
FIG. 16E

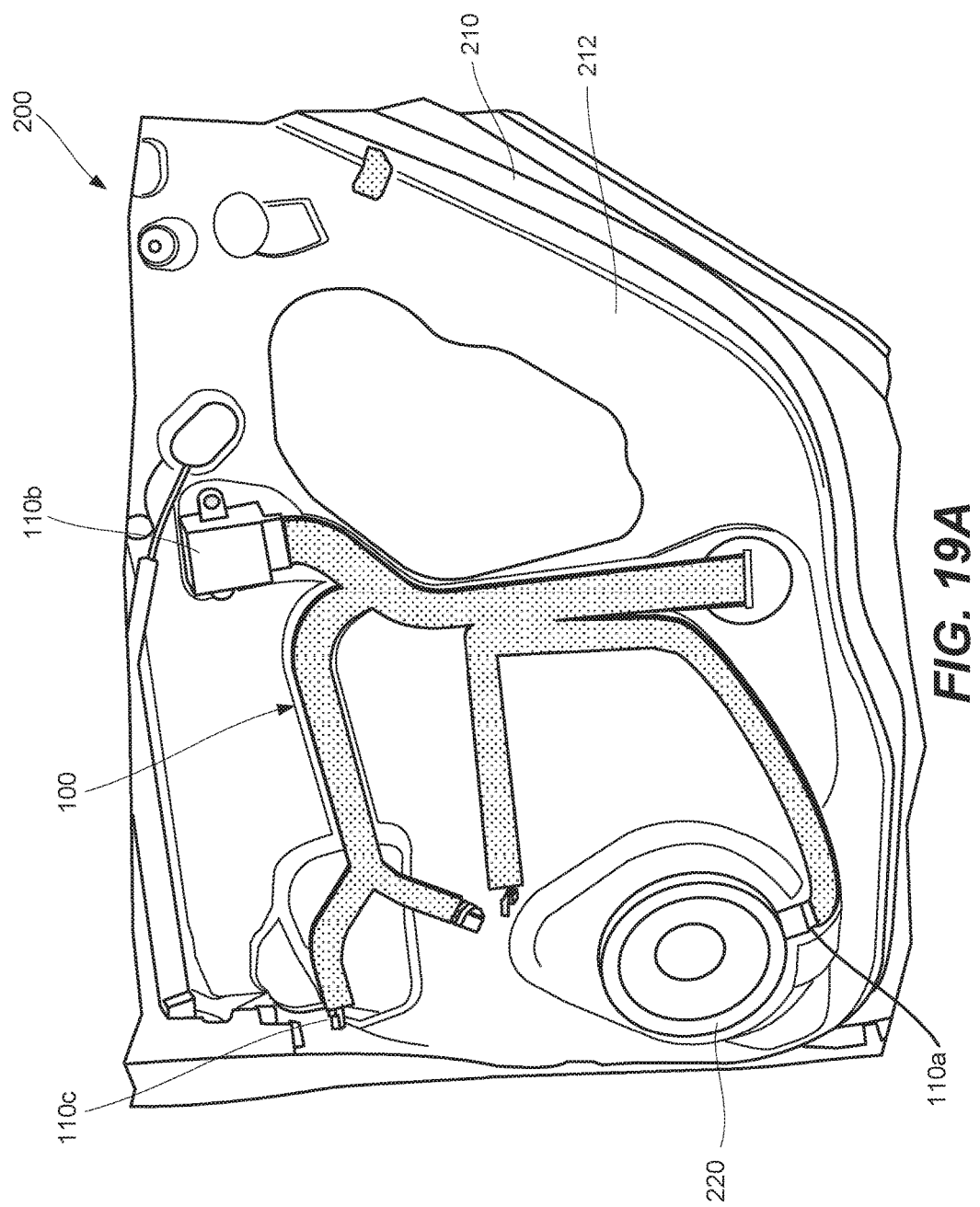

FLEXIBLE CIRCUITS FOR ELECTRICAL HARNESSES

CROSS-REFERENCE TO RELATED APPLICATIONS

This application is a continuation of U.S. application Ser. No. 16/164,722, entitled "FLEXIBLE CIRCUITS FOR ELECTRICAL HARNESSES" and filed on 18 Oct. 2018, which is a continuation of U.S. application Ser. No. 15/952,773, entitled "FLEXIBLE CIRCUITS FOR ELECTRICAL HARNESSES" and filed on 13 Apr. 2018, issued as U.S. Pat. No. 10,153,570 on 11 Dec. 2018, which claims the benefit under 35 U.S.C. § 119(e) of U.S. Provisional Patent Application 62/616,567, entitled: "FLEXIBLE CIRCUITS FOR ELECTRICAL HARNESSES" and filed on 12 Jan. 2018 and of U.S. Provisional Patent Application No. 62/485,544, entitled: "FLEXIBLE CIRCUITS FOR ELECTRICAL HARNESSES" and filed on 14 Apr. 2017, all of which are incorporated herein by reference in their entirety for all purposes.

BACKGROUND

Electrical power and control signals are typically transmitted to individual components of a vehicle or any other machinery or system using multiple wires bundled together in a harness. In a conventional harness, each wire may have a round cross-sectional profile and may be individually surrounded by an insulating sleeve. The cross-sectional size of each wire is selected based on the material and current transmitted by this wire. Furthermore, resistive heating and thermal dissipation is a concern during electrical power transmission requiring even larger cross-sectional sizes of wires in a conventional harness. As a result, harnesses can be rather bulky, heavy, and expensive to manufacture. Yet, automotive, aerospace and other industries strive for smaller, lighter, and less expensive components.

SUMMARY

Provided are electrical harness assemblies and methods of forming such harness assemblies. A harness assembly comprises a conductor trace, comprising a conductor lead with a width-to-thickness ratio of at least 2. This ratio provides for a lower thickness profile and enhances heat transfer from the harness to the environment. In some examples, a conductor trace may be formed from a thin sheet of metal. The same sheet may be used to form other components of the harness. The conductor trace also comprises a connecting end monolithic with the conductor lead. The width-to-thickness ratio of the connecting end may be less than that of the conductor trace, allowing for the connecting end to be directly mechanically and electrically connected to a connector of the harness assembly. The connecting end may be folded, shaped, slit-rearranged, and the like to reduce its width-to-thickness ratio, which may be close to 1.

In some embodiments, an electrical harness assembly comprises a connector and a first conductor trace. The connector comprises a first contact interface and a first connecting portion. The first conductor trace comprises a first conductor lead and a first connecting end. The first conductor lead and the first connecting end of the first conductor trace are monolithic. The first conductor lead has a width-to-thickness ratio of at least 2. The first connecting end of the first conductor trace electrically coupled to the first connecting portion of the connector.

In some embodiments, the first connecting portion of the connector comprises a base and one or more tabs. The first connecting end of the first conductor trace is crimped between the base and the one or more tabs of the first connecting portion. The first connecting end of the first conductor trace may be welded to the base, in addition to or instead of crimping using the tabs. The first connecting portion of the connector comprises a first plate and a second plate parallel to the first plate and forming a cavity. The first connecting portion further comprises a biasing element protruding into the cavity from the first plate toward the second plate. The first connecting end of the first conductor trace protrudes into the cavity and contacts the biasing element.

In some embodiments, the first connecting end of the first conductor trace has a width-to-thickness ratio less than the width-to-thickness ratio of the first conductor lead. The first connecting end may be folded and/or reshaped. The first connecting end may be slit into a plurality of strands, wherein the plurality of strands is bundled together.

In some embodiments, the electrical harness assembly further comprises a second conductor trace, comprising a second conductor lead and a second connecting end. The second conductor lead and the second connecting end of the second conductor trace may be monolithic. The second conductor lead may have a width-to-thickness ratio of at least 0.5. The thickness of the second conductor lead and the thickness of the first conductor lead are approximately equal. The second conductor lead and the first conductor lead do not contact each other.

In some embodiments, the second connecting end of the second conductor trace is electrically coupled to multiple connecting portions of the connector. The connector may comprise one or more jumpers electrically coupling the multiple connecting portions. The second conductor lead may be wider than the first conductor lead. In some embodiments, the first connecting end is a stack of multiple layers formed by folding the first conductor trace. The first connecting end is a stack of two layers.

Also provided is a car door assembly, comprising a car door and an electrical harness assembly. The car door comprises a surface. An electrical harness assembly directly interfaces the surface of the car door. The electrical harness assembly is attached to the surface of the car door. The electrical harness assembly may be conformal to the surface of the car door over at least 50% of the area of the electrical harness assembly. The electrical harness assembly may be attached to the surface of the car door along at least 50% of an interface between the electrical harness assembly and the surface of the car door.

In some embodiments, the electrical harness assembly comprises a first insulator, a first conductor trace, and a second insulator. The first conductor trace is disposed between the first insulator and the second insulator. The first insulator is disposed between the first conductor trace and the surface of the car door. The first insulator may be adhered to the surface of the car door using a thermally conductive mounting adhesive. The thermally conductive mounting adhesive may be a thermally conductive pressure-sensitive adhesive (PSA) film. The first insulator may comprise a material selected from the group consisting of polyimide (PI), polyethylene naphthalate (PEN), polyethylene terephthalate (PET), polymethyl methacrylate (PMMA), ethyl vinyl acetate (EVA), polyethylene (PE), polypropylene (PP), polyvinyl fluoride (PVF), polyamide (PA), soldermask, and polyvinyl butyral (PVB).

These and other embodiments are described further below with reference to the figures.

BRIEF DESCRIPTION OF THE DRAWINGS

FIG. 4A illustrates an example of a partially assembled electrical harness assembly having different portions that are ready to be folded and stacked together.

FIG. 4B illustrates an expanded view of a portion of the electrical harness assembly shown in FIG. 4A.

FIG. 11A is a schematic top view of a conductor trace prior to folding its connecting end and attaching a terminal, in accordance with some embodiments.

FIG. 11B illustrates a schematic cross-sectional view of the attachment portion of the conductor trace shown in FIG. 11A.

FIG. 11C is a schematic top view of the conductor trace shown in FIG. 11A after folding its connecting end, in accordance with some embodiments.

FIG. 11D illustrates a schematic cross-sectional view of the attachment portion of the conductor trace shown in FIG. 11C.

FIG. 11E illustrates a schematic top view of the conductor trace shown in FIGS. 11A and 11C after attaching the terminal, in accordance with some embodiments.

FIG. 16B illustrates a schematic top view of an insulator comprising three insulator openings that divide the insulator into four insulator strips.

FIG. 16C illustrates a schematic top view of the insulator shown in FIG. 16B with one end of the insulator turned 90° relative to the other end within a plane.

FIGS. 16D and 16E illustrate schematic cross-section views of the insulator strips of the insulator shown in FIG. 16C at different locations.

FIG. 19A illustrates a car door assembly comprising a car door and an electrical harness assembly mechanically supported by and thermally coupled to the car door, in accordance with some embodiments.

DETAILED DESCRIPTION

Figure 1A:
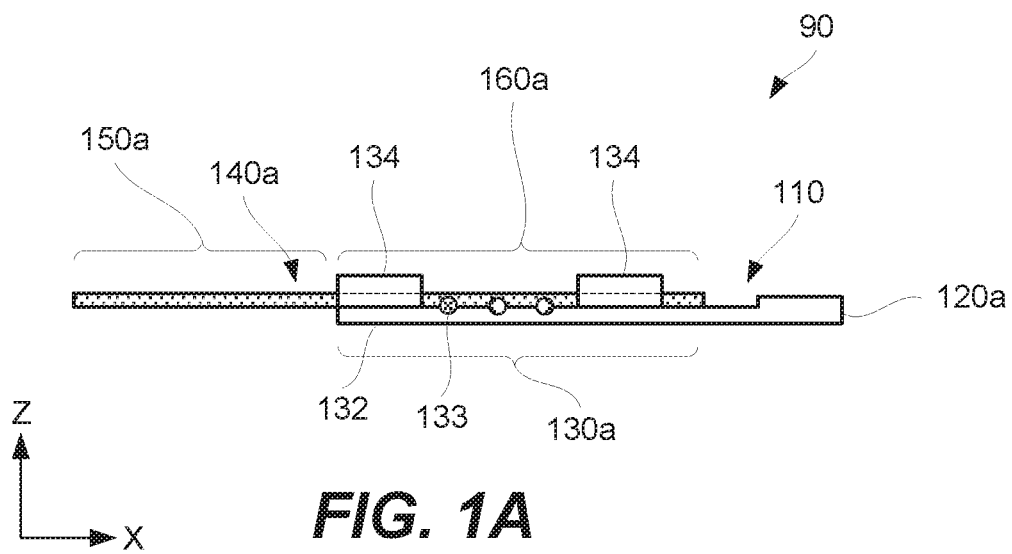
FIGS. 1A and 1B illustrate an electrical connector assembly, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

INTRODUCTION

Electrical harnesses are used to deliver power and/or signals in various applications, such as vehicles, appliances, electronics, and the like. Conventional harnesses typically utilize round wires formed from round conductive leads (e.g., solid round wires or stranded bundles of round wires)

insulated by polymer shells. These round wires are often bundled together into a harness. Unfortunately, these bundles can be hard to feed through narrow spaces. Furthermore, round wires have poor thermal connections to surrounding flat structures and therefore experience very little heat dissipation during their operation. As a result, larger gauge wires are often used in such harnesses to avoid excessive resistive (joule) heating. This wire oversizing, in turn, adds to the size, weight, and cost of a harness, all of which are not desirable.

Provided are harnesses formed using flat conductor traces, rather than wires with round cross-sections. These conductor traces may be formed, for example, from a sheet of foil. In some embodiments, all traces of the same harness may be formed from the same sheet of foil, thereby simplifying production of the harness and allowing for robust electrical connections between traces due to the monolithic nature of the sheet. In these embodiments, the formed traces may have a coplanar orientation or, more generally, the traces may be arranged as a one-dimensional array in some cross-sections of the harness. A combination of the flat conductor traces and their arrangement allows forming a harness that is both thin and flexible as well as capable of thermal coupling to surrounding structures. The thickness of the harness may be a combination of thicknesses of the conductor traces, one or two insulators, and one or more adhesive layers, if used. A thin harness or, more specifically, a thin, flexible harness can be fed through narrow spaces that may be not suitable for bundled conventional harnesses.

Because of the small overall thickness and the coplanar orientation of the conductor traces, the harness can be very flexible in at least a direction perpendicular to the plane of the harness. The flexibility may be a lot greater than that of a harness formed by the bundled wires. This flexibility may be used to conform the harness to various planar and non-planar surfaces, such as an interior surface of a car door which has many topographical variations. For example, the electrical harness assembly may be conformal to the surface of the car door over at least 50% of the area of the electrical harness assembly or, more specifically, at least 75% of the area o even at least 90% of the area.

Finally, the conformality and small thickness of the thin flexible harness allows for substantial cooling of individual conductor traces in the harness. As a result, the conductor traces with smaller cross-sectional areas may be used in the provided harness than in conventional harnesses. This thermal coupling and small wire cross-section, in turn, leads to a smaller weight, size, and cost of the harnesses.

Forming Connections to Flat Conductor Traces

One challenge with using flat conductor traces in a harness is forming electrical connections between such traces and other components, such as connectors and other traces/wires, which may have different dimensions or, more specifically, smaller width-to-thickness ratios. For example, connectors for wire harnesses may use contact interfaces that are square or round, or, more generally, have comparable widths and thicknesses (e.g., have a width-to-thickness ratio of about 1 or between 0.5 and 2). On the other hand, a conductor trace in a proposed flexible circuit may have a width-to-thickness ratio of at least about 2 or at least about 5 or even at least about 10. Such conductor traces may be referred to as flat conductor traces or flat wires to distinguish them from round wires. Various approaches are described herein to form electrical connections to the flat conductor traces.

Figure 1B:
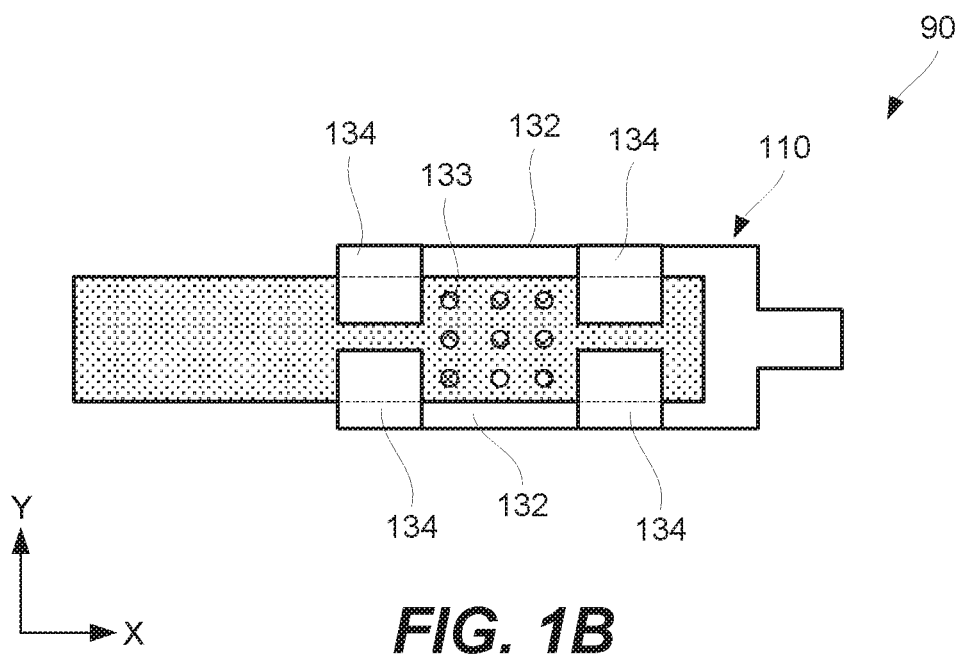

FIGS. 1A and 1B illustrate electrical connector assembly 90, in accordance with some embodiments. Electrical connector assembly 90 may be a part of electrical harness assembly 100 further described below. Electrical connector assembly 90 comprises connector 110 and conductor trace 140a, which may also be referred to as first conductor trace 140a to distinguish from other conductor traces of the same harness, if present. For simplicity, only one conductor trace is shown in these figures. However, one having ordinary skill in the art would understand that this and other examples are applicable to harnesses and connector assemblies with any number of conductor traces.

Connector 110 comprises first contact interface 120a and first connecting portion 130a. First contact interface 120a may be used to make an external connection formed by connector assembly 90 and may be in the form of a pin, socket, tab, and the like. First contact interface 120a and first connecting portion 130a may be made from the same materials (e.g., copper, aluminum, and the like). In some embodiments, first contact interface 120a and first connecting portion 130a are monolithic. For example, first contact interface 120a and first connecting portion 130a may be formed from the same strip of metal.

First conductor trace 140a comprises first conductor lead 150a and first connecting end 160a. First connecting end 160a is electrically coupled to first connecting portion 130a of connector 110. Specifically, first connecting end 160a and first connecting portion 130a may directly contact each other and overlap within the housing of connector 110.

In some embodiments, each connector is coupled to a different conductor trace. Alternatively, multiple connectors may be coupled to the same conductor trace.

Furthermore, a single connector may be coupled to multiple conductor traces. Finally, multiple connectors may be coupled to multiple conductor traces such that all of these connectors and traces are electrically interconnected.

Figure 20:
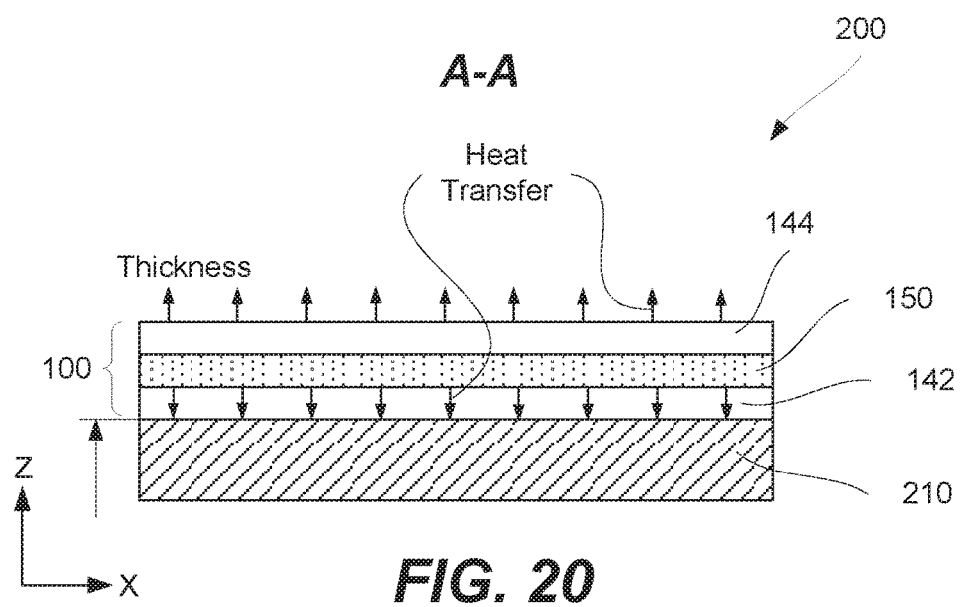
FIG. 20 illustrates various heat transfer aspects between a flat wire of the electrical harness assembly and the car door.

First conductor lead 150a extends away from connector 110, e.g., to another connector or forms some other electrical connection within connector assembly 90. The length of first conductor lead 150a may be at least about 100 millimeters, at least about 500 millimeters, or even at least about 3000 millimeters. First conductor lead 150a may be insulated on one or both sides using, for example, first insulator 142 and second insulator 144 as schematically shown in FIG. 20 and described below. In some embodiments, first insulator 142 and second insulator 144 do not extend to first connecting end 160a, allowing first connecting end 160a to directly interface first connecting portion 130a. Alternatively, one of first insulator 142 and second insulator 144 may overlap with first connecting portion 130a, while still exposing another side of first connecting end 160a and allowing this side to directly interface first connecting portion 130a. In some embodiments, electrical connections to first connecting portion 130a are made through openings in one of first insulator 142 and second insulator 144. In these embodiments, first insulator 142 and second insulator 144 may overlap with first connecting portion 130a. In further embodiments, external insulation to first connecting end 160a may be provided by connector 110 or by a pottant or encapsulant surrounding first connecting end 160a.

As shown in FIGS. 1A and 1B, both first conductor lead 150a and first connecting end 160a have the same thickness (e.g., formed from the same metal sheet). First connecting end 160a may have a width-to-thickness ratio of at least 0.5 or, more specifically, at least about 2 or even at least about 5 or even at least about 10. The width-to-thickness ratio of first conductor lead 150a may be the same or different.

In some embodiments, first connecting portion 130a of connector 110 comprises base 132 and one or more tabs 134.

Specifically, FIG. 1B illustrates four tabs 134 extending from base 132 (two from each side of base 132). However, any number of tabs can be used. First connecting end 160a of first conductor trace 140a is crimped between base 132 and tabs 134. The crimping provides electrical connection and mechanical coupling between connecting portion 130a and first connecting end 160a. The mechanical coupling helps to ensure that the electrical coupling is retained during operation of electrical harness assembly 100. For example, the connection between first connecting portion 130a and first connecting end 160a may be subject to mechanical stresses, creeping of the material (e.g., when one or both materials comprises aluminum), and the like. Furthermore, the mechanical coupling may be used to support first connecting end 160a of first conductor trace 140a by connector 110.

In some embodiments, first connecting end 160a of first conductor trace 140a is also welded or otherwise additionally connected to base 132 as, for example, schematically shown at locations 133 in FIGS. 1A and 1B. This connection may be carried out using various means, including but not limited to ultrasonic welding, laser welding, resistance welding, brazing, or soldering. This connection helps form a low-resistance, stable electrical contact between first connecting end 160a and interfacing base 132, and may be referred to as a primary electrical connection to distinguish from the electrical connection provided by a direct interface between connector 110 and first conductor trace 140a. This primary electrical connection may comprise an intermix of materials of first connecting end 160a and interfacing base 132 and form a local monolithic structure at each location 133. Therefore, if surface oxidation or other changes in surface conditions of first connecting end 160a and interfacing base 132 happen later, these changes will not impact this primary electrical coupling between first connecting end 160a and interfacing base 132.

Figure 2A:
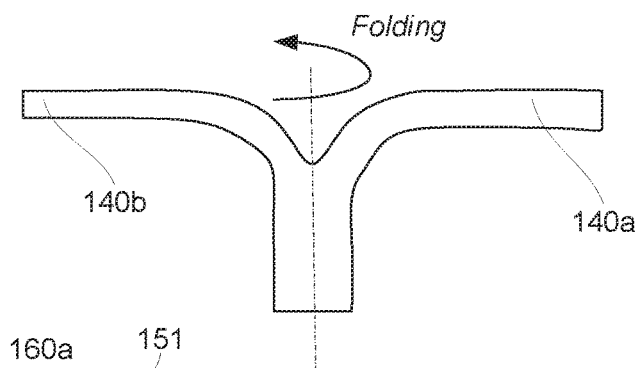
FIGS. 2A-2C illustrate an example of forming a connecting end of a conductor trace.
Figure 2B:
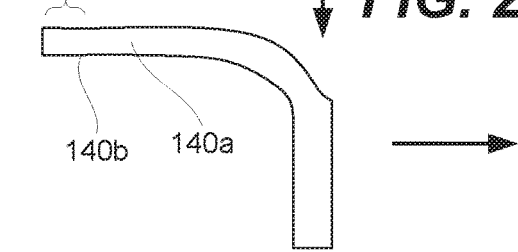
Figure 2C:
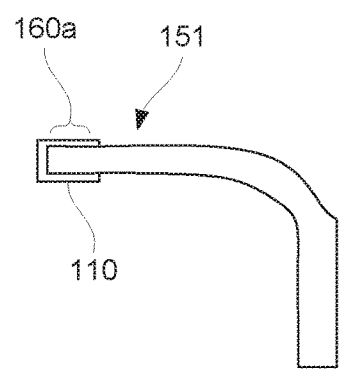
Figure 3A:
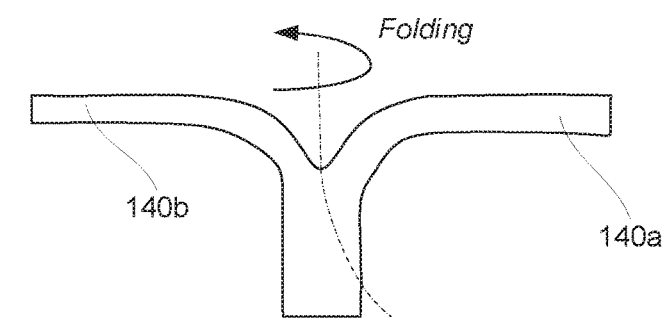
FIGS. 3A-3C illustrate another example of forming a connecting end of a conductor trace.
Figure 3B:
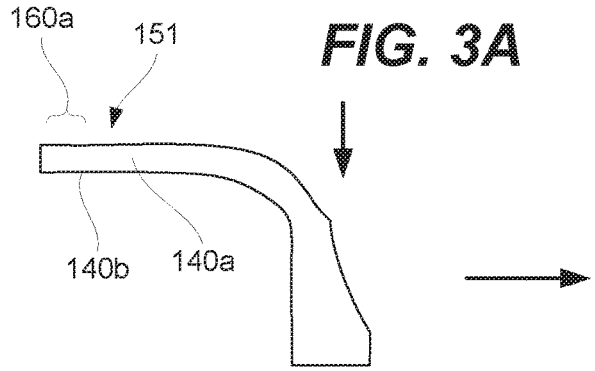
Figure 3C:
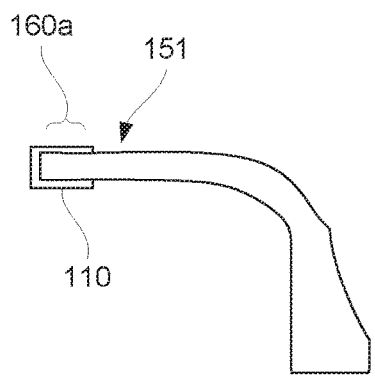

In some embodiments, for example in cases in which each of conductor traces 140 is not sufficiently thick to form such connections, multiple conductor traces 140 may be stacked together and this stack is coupled to connecting portion 130 of connector 110. Referring to FIGS. 2A-2B, first conductor trace 140a and second conductor trace 140b are folded to form stack 151. Connector 110 is then coupled to stack 151 as shown in FIG. 2C. FIGS. 3A-3C show a different folding pattern, which also results in first conductor trace 140a and second conductor trace 140b. While these examples (in FIGS. 2A-3C) shows a stacked form by two conductor traces, one having ordinary skill in the art would understand that any number of conductor traces may be stacked together by folding or other means. Furthermore, FIGS. 2A-2B and FIGS. 3A-3C illustrate first conductor trace 140a and second conductor trace 140b being joined together away from connector 110. Alternatively, first conductor trace 140a and second conductor trace 140b may be completely disjoined away from connector 110 and form an electrical connection only at connector 110. Furthermore, in some examples, first conductor trace 140a and second conductor trace 140b may remain electrically insulated from each other and may be coupled to different rows of a connector or different connectors altogether as, further described below with reference to FIGS. 14A-C.

FIG. 4A illustrates an example of electrical harness assembly 100, which is only partially assembled and does not have connectors attached to its conductor traces. Electrical harness assembly 100 comprises different portions 101a-101d, used for attachment of connectors. Prior to this attachment, various combinations of these different portions 101a-101d may be stacked together in a way similar to the one described above with reference to FIGS. 2A-2B and FIGS. 3A-3C. For example, portion 101a may be stacked with portion 101b such that multiple conductor traces 140a-140c of portion 101a (shown in FIG. 4B) overlap with corresponding conductor traces of portion 101b. In a similar manner, portion 101c is ready to be stacked with portion 101d such that their corresponding conductor traces overlap. For example, portions 101a and 101b may be folded towards each other and inserted into a single connector that is able to accept and make connections to two or more rows of conductor traces. In the latter example, to prevent the conductor traces of portion 101a from inadvertently contacting portion 101b near the connector, an insulating layer may be placed in between the two portions 101a and 101b. Alternatively, portions 101a-101d or similar portions may be folded in such a way that an insulating layer, which may be also referred to as a base layer, is stacked in conductor traces on each folded end. In other words, the conductor traces remain electrically insulated even when stacked.

Figure 5:
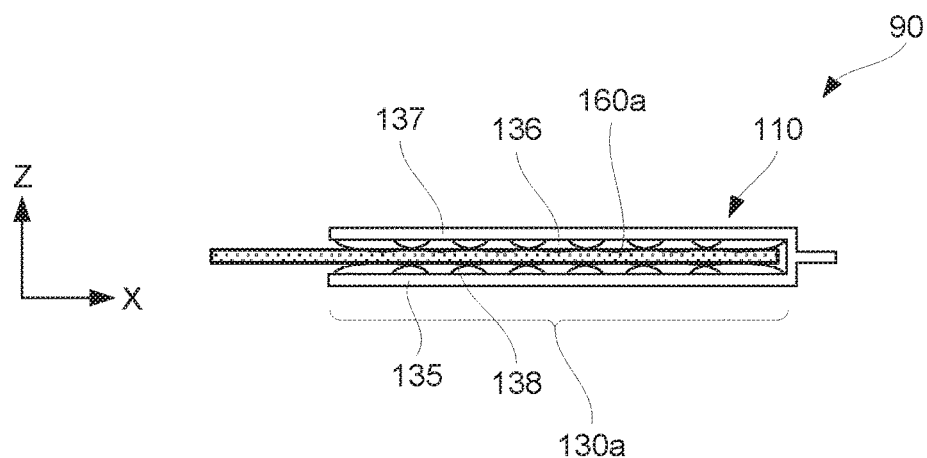
FIG. 5 illustrates an example of a connecting portion of a connector coupled to a conductor trace using a biasing element disposed in a cavity of the connecting portion.

Referring to FIG. 5 illustrates one example of illustrate electrical connector assembly 90, first connecting portion 130a of connector 110 comprises first plate 135 and second plate 137 parallel to first plate 135 and forming cavity 136. First connecting portion 130a further comprises biasing element 138 protruding into cavity 136 from first plate 135 to second plate 137. First connecting end 160a of first conductor trace 140a protrudes into cavity 136 and contacts biasing element 138. Biasing element 138 maintains contact with first connecting end 160a even if first connecting end 160a starts changing its shape (e.g., creep). Biasing element 138 may be a spring or, more specifically, a set of springs, such as leaf springs. Alternatively, connector 110, in its entirety, may be spring loaded or may be formed so that connector 110 compresses against first connecting end 160a when first connecting end 160a is inserted into connector 110.

Figure 6:
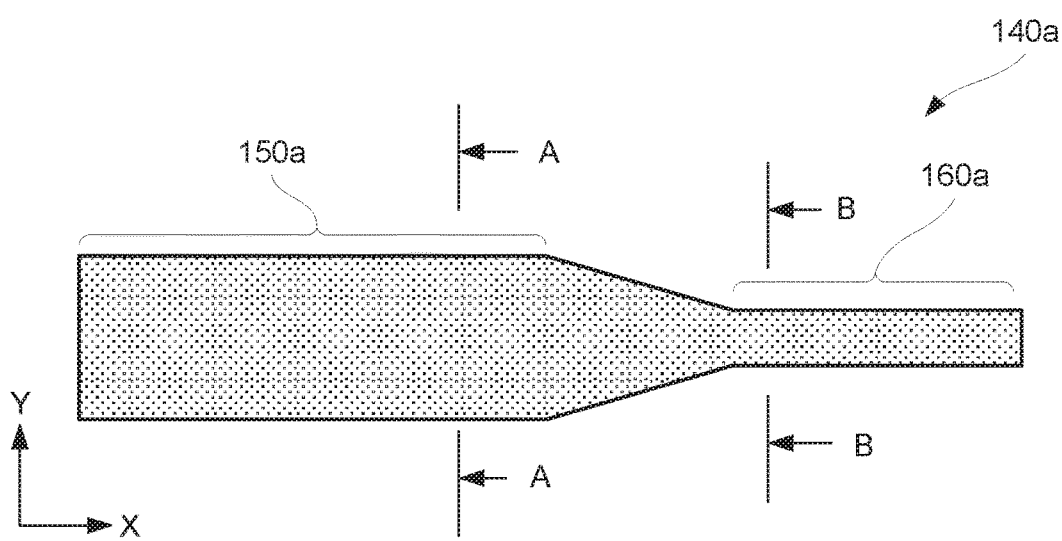
FIG. 6 is a top schematic view of a conductor trace, in accordance with some embodiments.
Figures 7A, 7B:
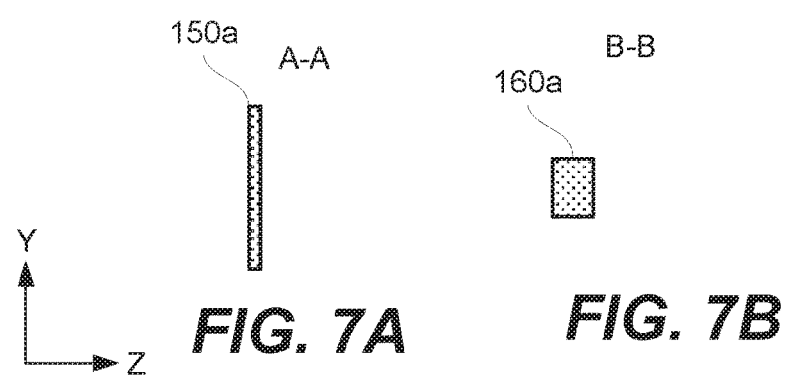
FIGS. 7A and 7B are cross-sectional schematic views of different parts of the conductor trace shown in FIG. 6, in accordance with some embodiments.

Referring to FIGS. 6 and 7A-7B, first connecting end 160a of first conductor trace 140a may have a width-to-thickness ratio different than the width-to-thickness ratio of first conductor lead 150a. For example, first conductor lead 150a may be a foil strip, while first connecting end 160a may be patterned or formed into some other shape (e.g., from the same foil strip). Different width-to-thickness ratios allow first connecting end 160a to form robust electrical and mechanical connections to a connector and, at the same time, allow first conductor lead 150a to maintain a low thickness profile away from the connector.

Figures 8A, 8B, 8C:
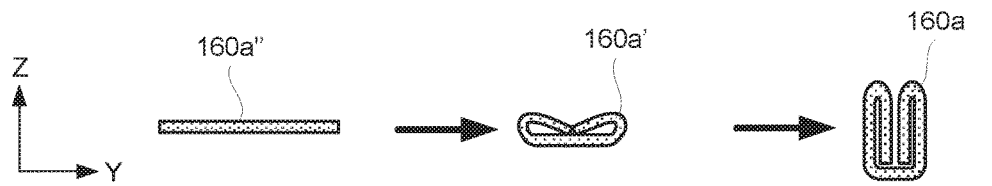
FIGS. 8A-8C illustrate an example of folding a connecting end of a conductor trace.
Figures 9A, 9B, 9C:
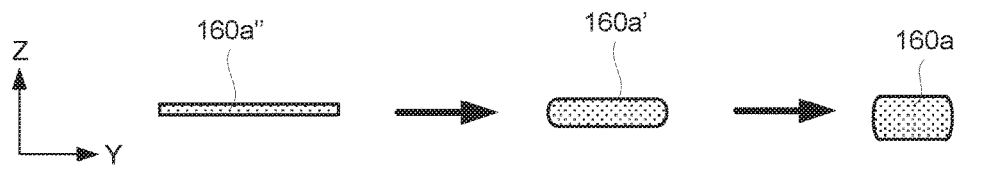
FIGS. 9A-9C illustrate an example of shaping a connecting end of a conductor trace.
Figures 10A, 10B, 10C:
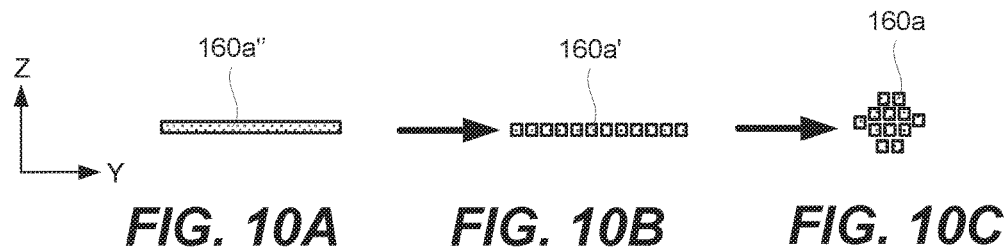
FIGS. 10A-10C illustrate an example of slitting and bundling individual strands of a connecting end of a conductor trace.

Different width-to-thickness ratios of first connecting end 160a and first conductor lead 150a may be achieved in various ways. For example, first connecting end 160a may be folded, as for example, schematically shown in FIGS. 8A-8C. In another example, first connecting end 160a may be reshaped, as for example, schematically shown in FIGS. 9A-9C. In yet another example, first connecting end 160a may be slit into a plurality of strands, which are bundled together, for example, as schematically shown in FIGS. 10A-10C. As such, first connecting end 160a may start as foil strip 160a" that goes through an intermediate shaping stage 160a' before being formed into first connecting end 160a.

Folding Examples

FIG. 11A is a schematic top view of conductor trace 140, comprising conductor lead 150 and connecting end 160, prior to folding connecting end 160 and attaching terminal 111 (not shown) to connecting end 160. Terminal 111 may be a part of a connector described above or the entire connector.

In this example, connecting end 160 comprises attachment portion 162, fold portion 164, and transition portion 166, such that transition portion 166 is between conductor lead 150 and fold portion 164, while fold portion 164 is positioned between attachment portion 162 and transition portion 166. Fold portion 164 and transition portion 166 are optional. In some examples, conductor lead 150 interfaces directly with attachment portion 162. Alternatively, one of fold portion 164 and transition portion 166 is positioned between conductor lead 150 and attachment portion 162.

Attachment portion 162 comprises multiple strands 161, which may be formed by slitting a metal sheet. FIG. 11B illustrates a schematic cross-sectional view of attachment portion 162 prior to its folding. Strands 161 may be coplanar at this stage.

Overall, conductor lead 150 and connecting end 160 may be monolithic (e.g., formed from the same sheet of metal). All components of connecting end 160, which may be attachment portion 162, fold portion 164, and transition portion 166 (in this example) are also monolithic. Various processing techniques may be used to form each of these portions, such as slitting, die cutting, laser cutting, waterjet cutting, or stamping.

The cross-sectional shape of at least attachment portion 162 and, in some embodiments, the cross-sectional shapes of fold portion 164 and transition portion 166, change during folding of connecting end 160 as, for example, schematically shown in FIGS. 11C and 11D. Specifically, attachment portion 162 is reshaped into a bundle that has a smaller width-to-thickness ratio than attachment portion 162 prior to folding. More specifically, strands 161 are rearranged from their original coplanar shape to a new arrangement. In should be noted that while connecting end 160 is folded, conductor lead 150 remains substantially the same. Once connecting end 160 is folded, terminal 111 may be attached (e.g., crimped) to attachment portion 162 as, for example, schematically shown in FIG. 11E. Various other attachment techniques (e.g., welding, soldering) are also within the scope.

Attachment portion 162 directly interfaces and overlaps with terminal 111 as, for example, schematically shown in FIG. 11E. Prior to folding, attachment portion 162 comprises multiple strands 161, separated by slits and/or gaps as, for example, shown in FIGS. 11A and 11B. For purposes of this disclosure, a slit is defined as a separation between two adjacent strands that has zero or minimal width but allows these strands to move out of plane with respect to each other. Gaps have a measurable width and are usually formed by removal of material while forming strands 161. FIGS. 11A and 11B illustrate six strands 161 forming attachment portion 162; however, any number of strands 161 is within the scope (two, three, four, ten, twenty, etc.). In this example, all strands 161 have the same width ($W_S$), and gaps between any pair of adjacent strands 161 have the same width ($W_T$) and are separated by the same gap. However, as further described below with reference to FIGS. 13A-13D, strands 161 may have different widths and/or gaps. Various combinations of widths and/or gaps may be used to ensure tighter packing in the bundle. The total width ($W_T$) of attachment portion 162 is a combination of all widths of strands and all widths of gaps, if such gaps are present. $W_S$ and $W_T$ may be chosen such that the total cross-sectional area of the conductor material in attachment portion 162 is greater than the cross-sectional area of conductor lead 150, for example, to account for generally poorer heat dissipation of a stranded wire shape relative to a flat conductor.

When fold portion 164 is present, it extends to terminal 111 but does not overlap with terminal 111. Fold portion 164 may also comprise strands 161 or parts thereof. However, when conductor trace 140 is folded, portions of strands 161 have different arrangements in fold portion 164 and in attachment portion 162. Specifically, the portion of strands 161 in fold portion 164 may be twisted and/or folded to provide transition to the arrangement of strands in attachment portion 162. The portion of strands 161 in attachment portion 162 may be substantially parallel to each other (e.g., aligned along the center axis extending in the X direction). This parallel arrangement in attachment portion 162 allows applying large crimping forces to attachment portion 162 without braking strands 161, which in turn preserves mechanical integrity and continuity of strands 161. Furthermore, this parallel arrangement allows forming a bundle with a uniform cross-section (along the center axis), which in turn provides the maximum interface area with terminal 111. In other words, bumps and other protrusions associated with twisting and folding are avoided in attachment portion 162.

Transition portion 166 may or may not have individual strands, gaps, or slits. Transition portion 166 may be positioned between conductor lead 150 and fold portion 164 and used to transition from a smaller width of conductor lead 150 ($W_L$) to a much larger width ($W_T$) of fold portion 164. Transition portion 166 effectively allows protecting rooted ends of strands 161 from stresses. Transition portion 166 may be also partially folded. However, the degree of folding may be less than that of fold portion 164.

Figure 12A:
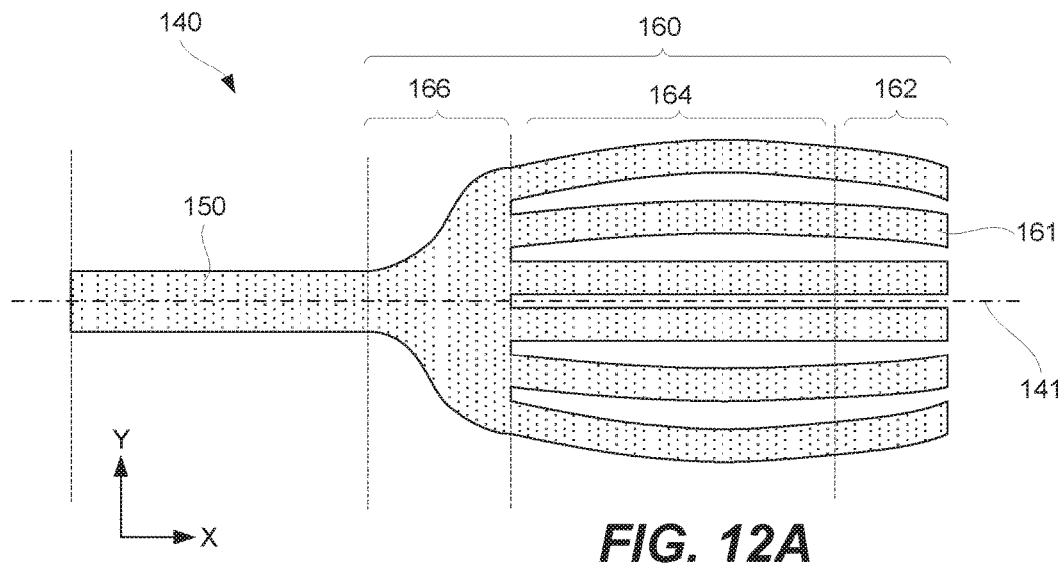
FIGS. 12A-12C illustrate schematic top views of different examples of a conductor trace prior to folding its connecting end, in accordance with some embodiments.
Figure 12B:
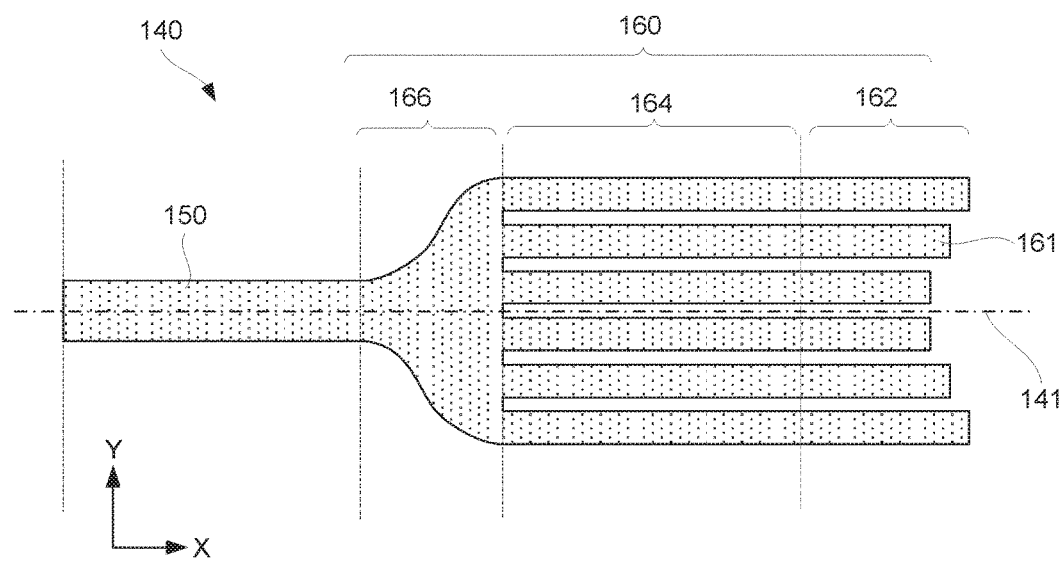

FIGS. 12A and 12B illustrate two examples of conductor traces 140 with strands 161 having different lengths. As described above, strands 161 are folded from their initial coplanar arrangement (e.g., shown in FIGS. 12A and 12B as well as FIGS. 11A and 11B) to a different (bundled) shape (e.g., shown in FIGS. 11C and 11D). This folding is used to accommodate terminal 111, which typically has a smaller width-to-thickness ratio than strands 161 in their initial unfolded state. The folding process involves bringing strands 161 closer to center axis 141 of conductor trace 140. However, some strands 161 are further away from center axis 141 and need to be folded more than strands 161 that are closer to center axis 141. To accommodate this difference in folding distances, strands 161 that are further away from center axis 141 may be longer than strands 161 that are closer to center axis 141. This length difference may be provided by different curvatures of strands 161 as, for example, shown in FIG. 12A. In this example, the projection of strands 161 onto center axis 141 may be substantially the same. Furthermore, the free ends of strands 161 may be substantially coplanar. For purposes of this disclosure, the term "substantially coplanar" is defined as deviation from a common plane of less than 5 millimeters or even less than 2 millimeters. It should be noted that the free ends of strands 161 may remain substantially coplanar during and after folding.

FIG. 12B illustrates another example in which all strands are straight and/or substantially parallel to center axis 141 in their initial flat/before folding shape. For purposes of this disclosure, the term "substantially parallel" is defined as angular difference of less than 10° or even less than 5°. In this example, the free ends of strands 161 are not coplanar before folding. However, after folding, the free ends of strands 161 may be substantially coplanar.

In some embodiments, when the free ends of strands 161 are not substantially coplanar after folding, these free ends may be trimmed to ensure that newly formed ends (i.e., trimmed ends) are substantially coplanar. However, various features of conductor traces 140 described above may be used to yield substantially coplanar free ends of strands 161 after folding of conductor traces 140 without a need for trimming. Alternatively, a trimming operation may be used in conjunction with one or both features described above with reference to FIGS. 12A and 12B.

Figure 12C:
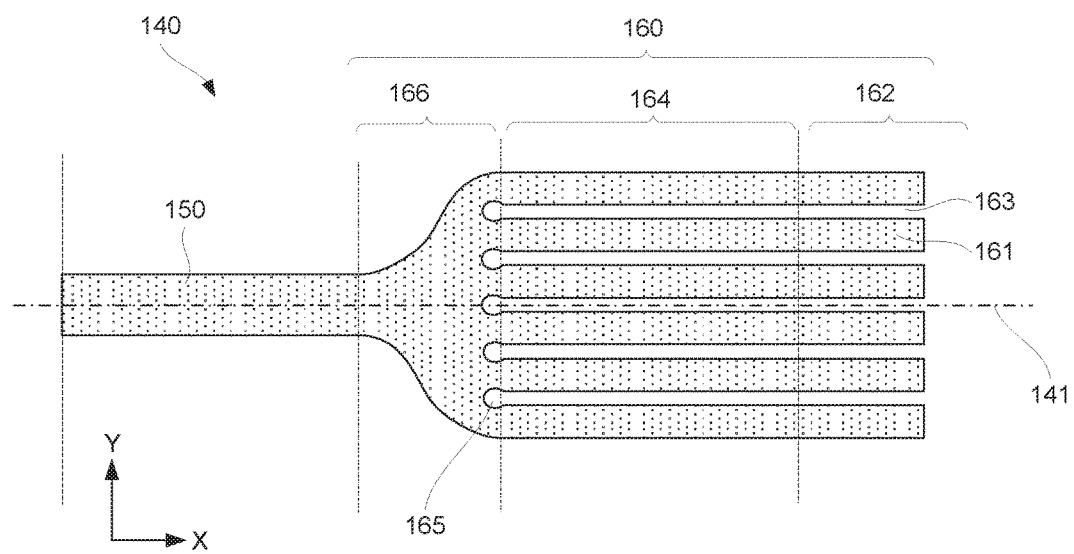

FIG. 12C illustrates an example of conductor trace 140 in which gaps 163 between strands 161 terminate with stress relief features 165. Stress relief features 165 may be free from sharp corners (e.g., corners with a curvature radius of less than 1 millimeter). For example, stress relief features 165 may have a circular profile and may have a minimum radius of at least 2 millimeters or even at least 5 millimeters. Elimination of the sharp corners allows reducing stress concentration points while folding and after folding of conductor trace 140. For example, strands 161 may be bent, twisted, and/or folded around center axis 141 while conductor lead 150 remains flat.

FIGS. 13A-13D illustrate different examples of bundles formed by strands 161 in attachment portion 162. Strands 161 are specifically formed and folded to fill cross-sectional profile 167, which has a circular profile in this example. It should be noted that, in some examples, strands 161 are formed from the same sheet of metal and, as such, have the same thickness. The width of strands 161 and, as a result, the width-thickness ratios, may be the same or different. Controlling the number of strands 161, the width of each strand 161, and the folded orientation of each strand 161 may be used to achieve different filling ratios, which may be higher than, for example, is possible with round wires 161' shown in FIG. 13E, as reference. For purposes of this disclosure, the filling ratio is defined as a sum of all cross-sectional areas of strands 161 divided by the area of cross-sectional profile 167. In some embodiments, this filling ratio is at least about 80% or even at least about 90%.

Figure 13A:
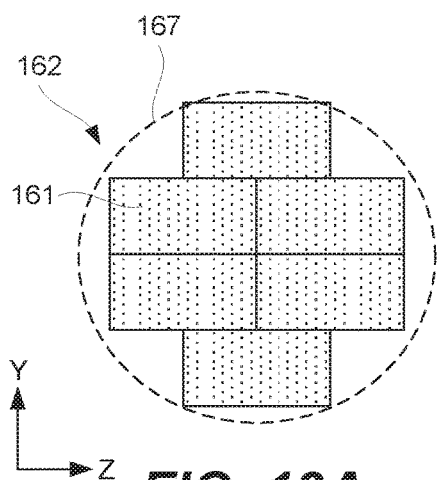
FIGS. 13A-13E illustrate schematic cross-sectional views of the attachment portion of the conductor trace after folding its connecting end, in accordance with some embodiments.
Figure 13B:
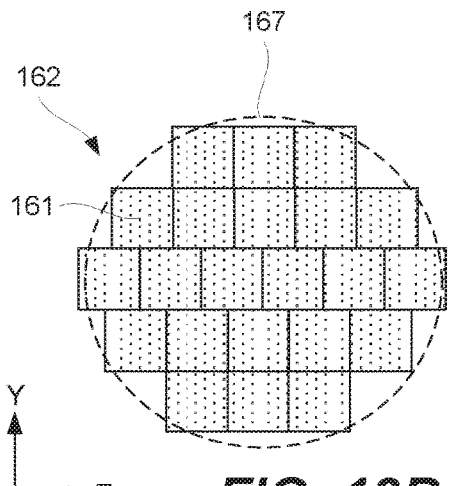

FIG. 13A illustrates an example of a bundle formed by strands 161, which all have the same rectangular cross-sectional profile. Furthermore, the orientations of these rectangular cross-sectional profiles are the same (e.g., all long side are parallel to each other). FIG. 13B illustrates an example of a bundle formed by strands 161 all having the same square cross-sectional profile.

Figure 13C:
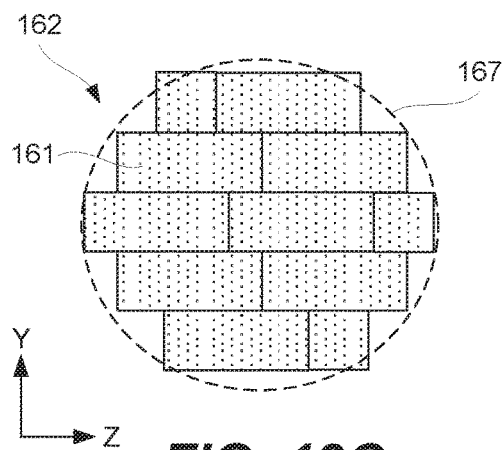
Figure 13D:
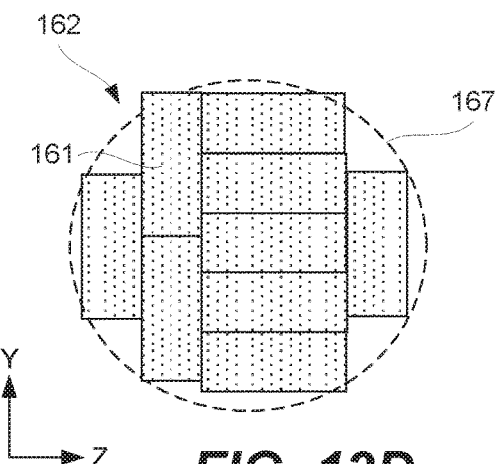
Figure 13E:
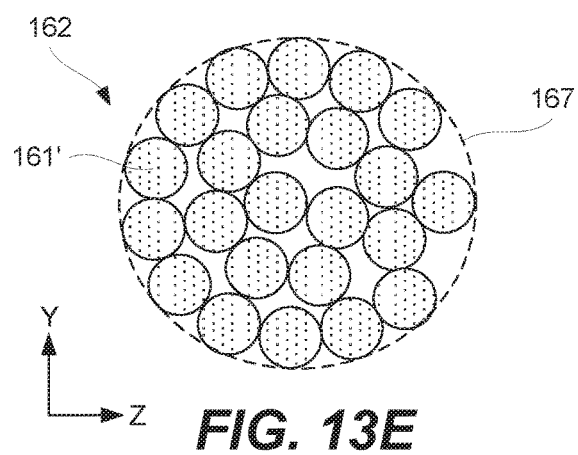

FIG. 13C illustrates an example of a bundle formed by strands 161 having both rectangular and square cross-sectional profiles. While only two types of profiles are shown in this example, one having ordinary skill in the art would understand that any number of different cross-sectional profiles may be used in the same bundle. For example, all strands 161, forming the same bundle, may have different widths. FIG. 13D illustrates another example of a bundle formed by strands 161 all having the same rectangular cross-sectional profile. However, unlike the example shown in FIG. 13A, the orientations of these rectangular-cross-section profiles differ. For example, some strands 161 are turned 90° relative to other strands. Any degree of rotation of the strands 161 is within the scope.

Figure 14A:
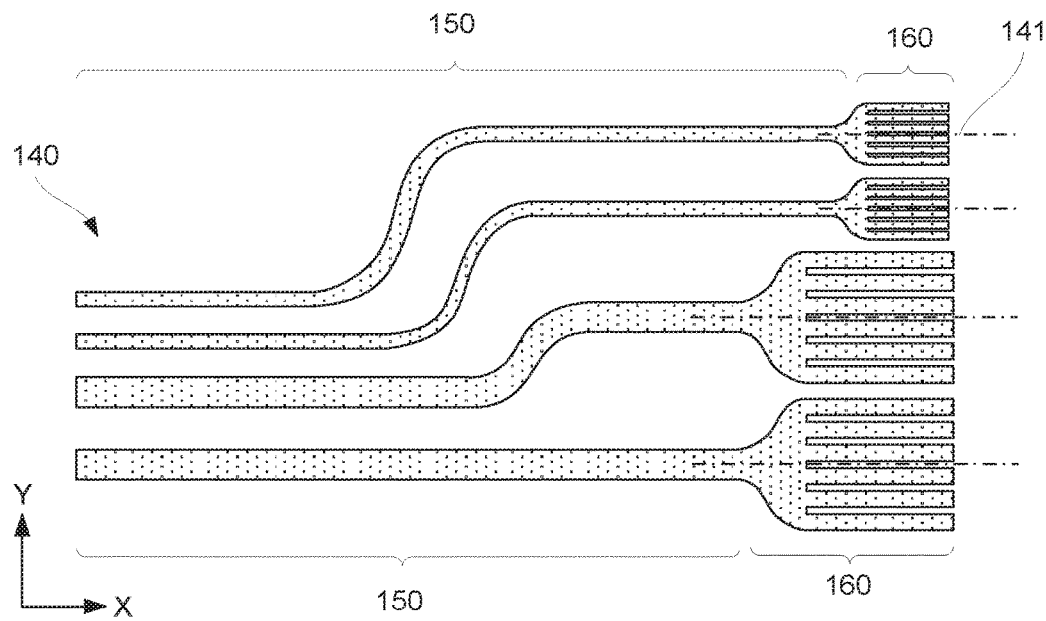
FIG. 14A illustrates a schematic top view of four conductor traces prior to folding and repositioning their connecting ends and attaching terminals, in accordance with some embodiments.
Figure 14B:
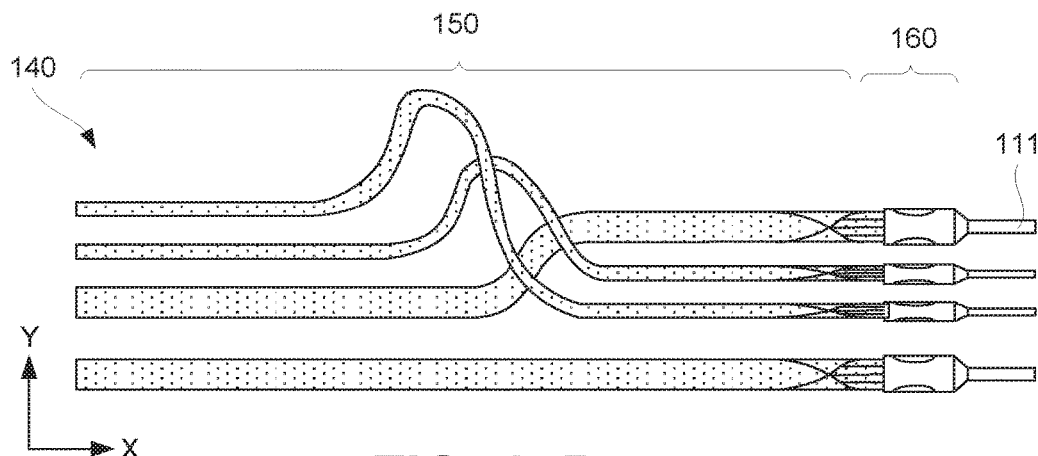
FIG. 14B illustrates a schematic top view of the four conductor traces shown in FIG. 14A after folding and repositioning their connecting ends and attaching terminals, in accordance with some embodiments.

FIGS. 14A and 14B illustrate four conductor traces 140 before and after connecting these conductor traces 140 to terminals 111. Folding of connecting ends 160 and crimping of terminals 111 to these connecting ends 160 are described above with reference to FIGS. 11A-11E. In some embodiments, the position of terminals 111 as determined by their final locations within a connector may be different from the positions of center axes 141 of individual connecting ends 160. Referring to FIGS. 14A and 14B, center axes 141 of individual connecting ends 160 are spaced apart more than terminals 111. This larger spacing may be due to connecting ends 160 being formed from the same metal sheet, while terminals 111 may have to be positioned in the same compact connector. To accommodate this difference, conductor leads 150 may be folded to align their connecting ends 160 with respective terminals 111.

Figure 14C:
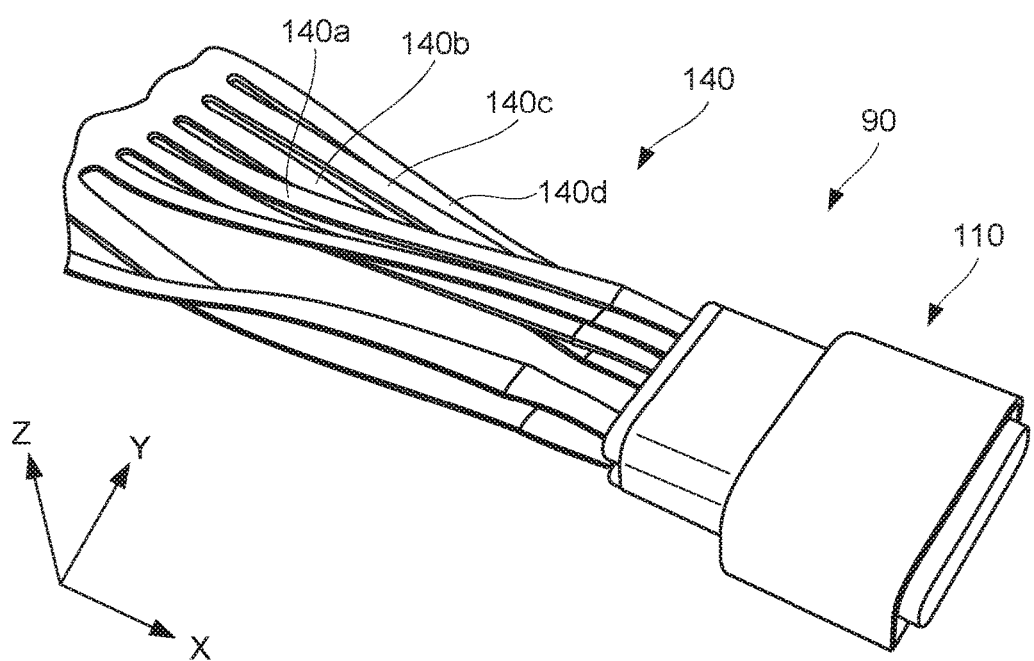
FIG. 14C illustrates a schematic top view of conductor traces positioned out of plane and forming connections to terminals of the connector at different levels.

As shown in FIG. 14B, in some embodiments, folding of conductor leads 150 may cause one or more conductor leads to overlap. However, conductor traces 140, which are generally insulated (e.g., covered in an insulation shell or positioned between insulating layers) away from connecting ends 160, may remain electrically insulated when their conductor leads 150 overlap. For example, conductor leads 150 may be insulated at the overlap location (e.g., one or more insulator layers may be positioned between two overlapping conductor leads 150). Furthermore, as shown in FIG. 14C, conductor traces 140 may be positioned out of plane (in the Z direction) and form connections to different terminals of connector 110 at different levels (spread in the Z-direction). For example, first conductor trace 140a extends above second conductor trace 140b, third conductor trace 140c, and fourth conductor trace 140d, and forms a connection to a different (higher) level of connector 110. Furthermore, FIG. 14C illustrates the ability of conductor traces 140 to cross in other directions (in the Y direction). In this example, first conductor trace 140a crosses over (in the Y direction) second conductor trace 140b and third conductor trace 140c and forms a connection roughly above fourth conductor trace 140d. This feature may provide an extra degree of freedom in terms of routing signals from one module to another within a vehicle or any other type of a device.

Figure 14D:
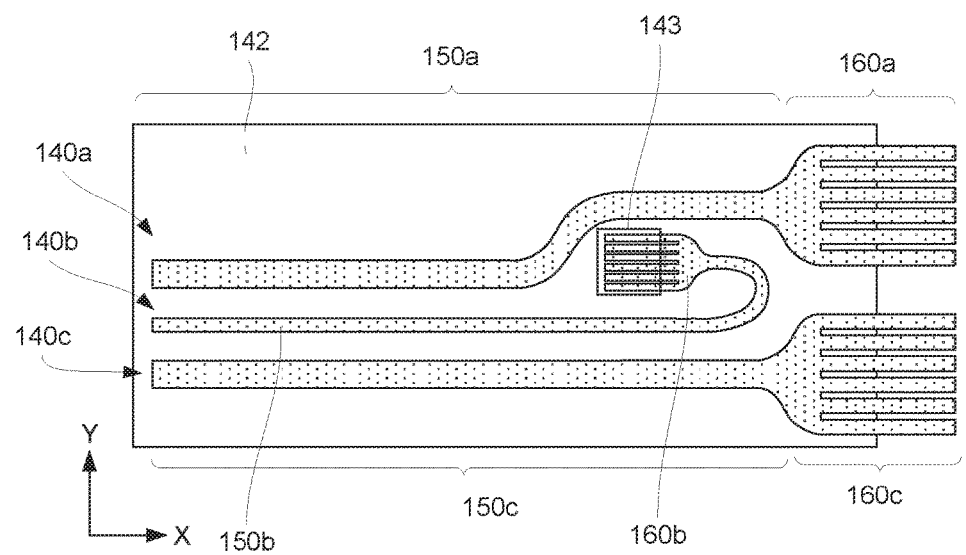
FIGS. 14D and 14E illustrate a schematic top view of three conductor traces before and after connecting these conductor traces to terminals.
Figure 14E:
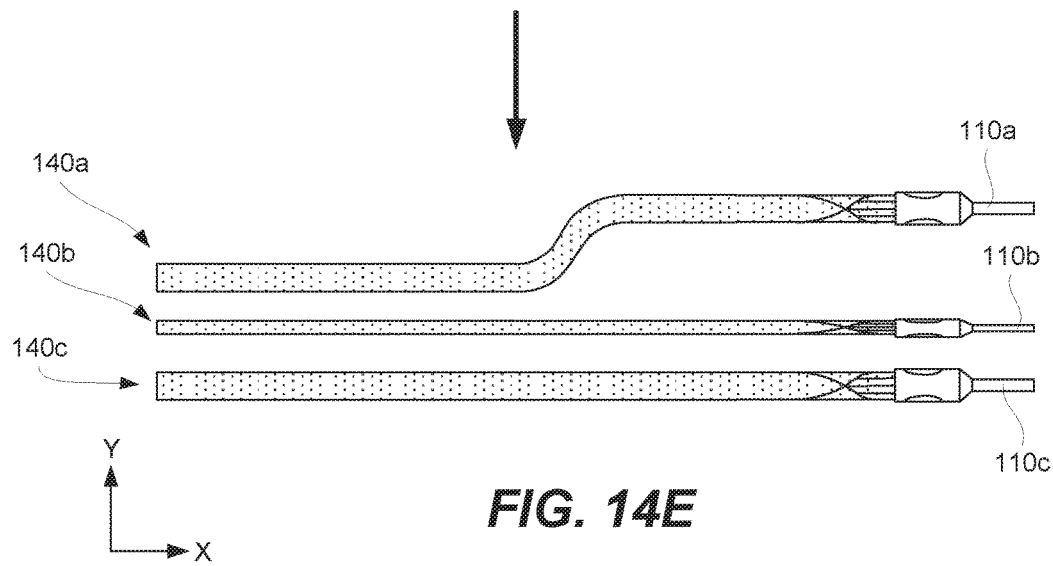

FIGS. 14D and 14E illustrate three conductor traces 140a-140c before and after connecting these conductor traces 140a-140c to terminals 111a-111c. Prior to connecting these conductor traces 140a-140c to terminals 111a-111c, conductor traces 140a-140c may extend within a bendable plane (e.g., defined by insulator 142 or a temporary liner). Insulator 142 may be also referred to as first insulator 142 when additional insulators (e.g., second insulator 144) are present. However, spacing between first connecting end 160a and third connecting end 160c (within the X-Z cross-section) may not be sufficient to accommodate connecting end 160b. As a result, connecting end 160b is formed in a pre-folded state and positioned between first conductor lead 150a and third conductor lead 150c as shown in FIG. 14D. When first connecting end 160a and third connecting end 160c are connected to their respective terminals 111a and 111c, more space is available in between these connecting ends 160a and 160c and connecting end 160b can now be accommodated, at least in the folded state, as shown in FIG. 14E.

Figure 15A:
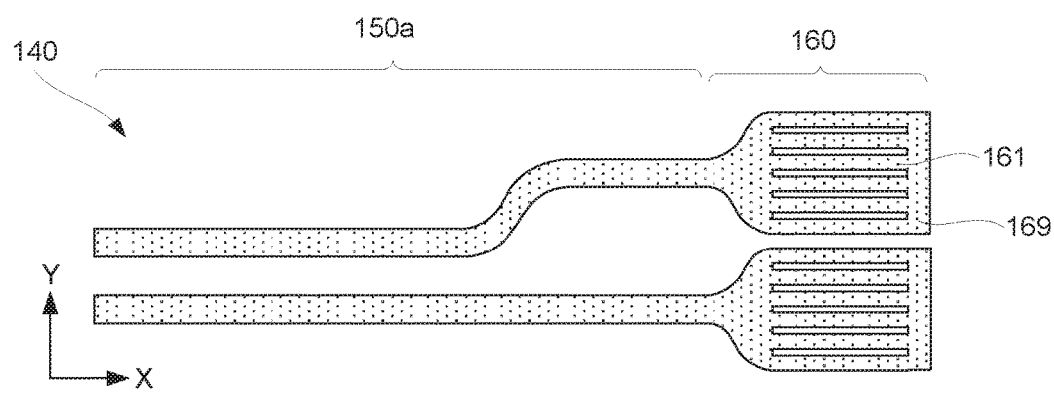
FIG. 15A illustrates a schematic top view of conductor traces with partially formed connecting ends.

FIG. 15A illustrates conductor traces 140 with partially formed connecting ends 160. In this example, strands 161 do not have free ends. This feature simplifies handling of connecting ends 160, in particular transferring conductor traces 140 from one supporting substrate to another, folding connecting ends 160, and/or performing other operations. At this stage, strands 161 supported by bridging part 169. Bridging part 169 may be removed before or after folding connecting ends 160.

Figure 15B:
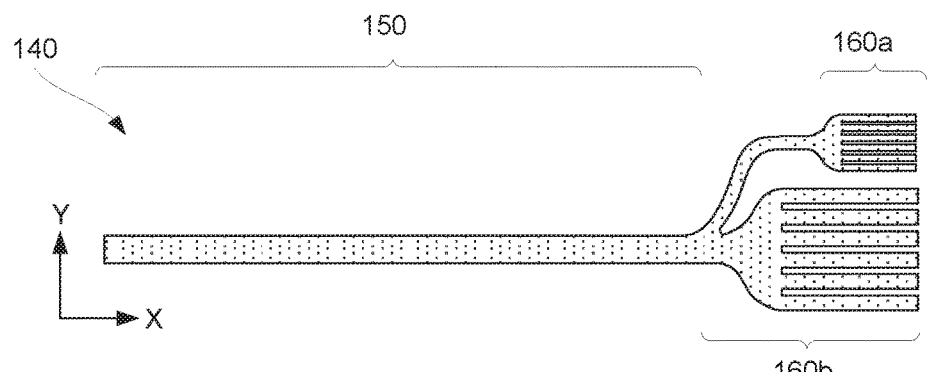
FIG. 15B illustrates a schematic top view of the conductor traces of FIG. 15A now with fully formed connecting ends.

FIG. 15B illustrates an example of hybrid conductor traces 140, which include one conductor lead 150 and two connecting ends 160a and 160b. For example, one connecting end 160a may be used for power transmission (and rated for a higher current) while another connecting end 160b may be used for signal (and rated for a smaller current). The size of each connecting end is selected for these current ratings and to accommodate corresponding connector terminals.

Figure 16A:
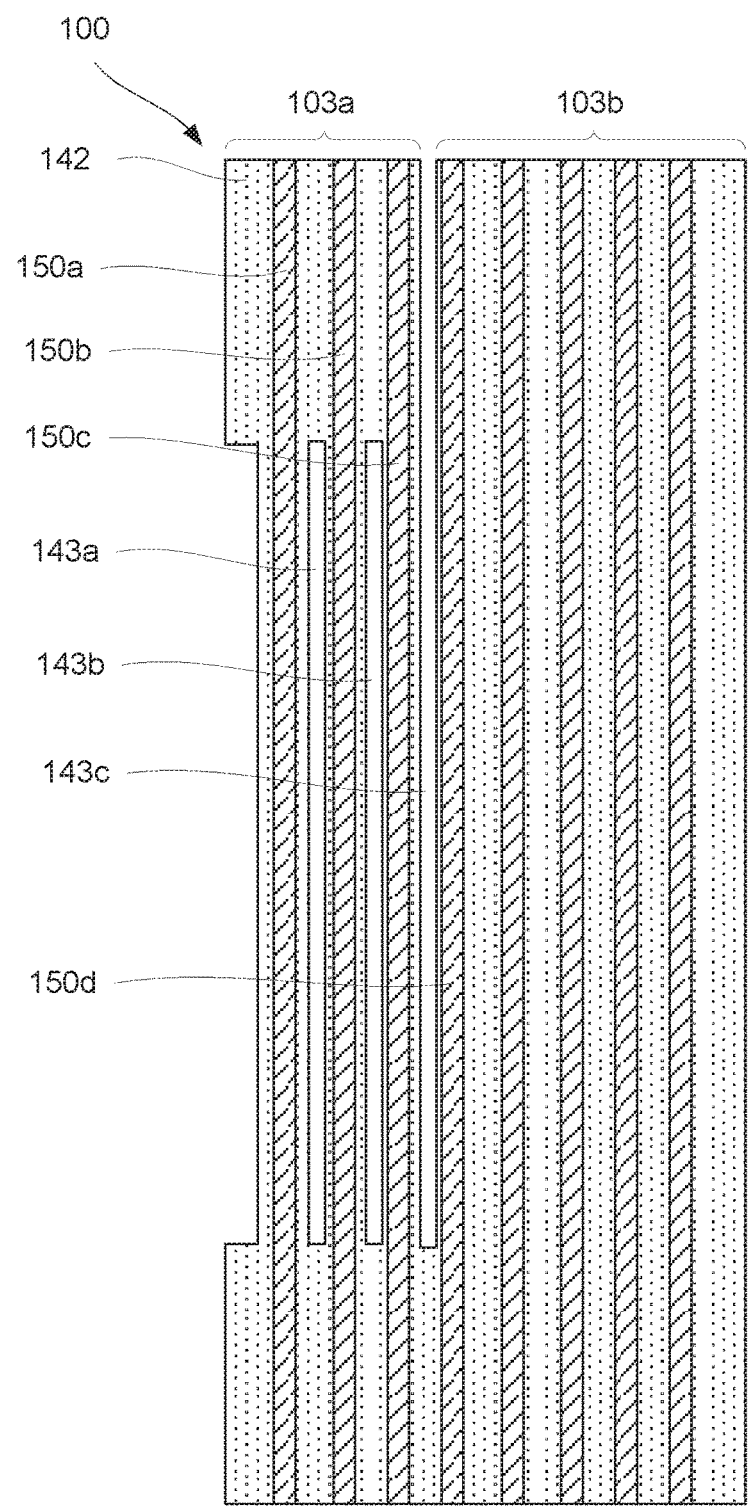
FIG. 16A illustrates a schematic top view of a harness assembly comprising an insulator and multiple conductor leads adhered to and supported by the insulator.

FIG. 16A illustrates electrical harness assembly 100 comprising insulator 142 and multiple conductor leads 150a-150c adhered to and supported by insulator 142. Insulator 142 comprises different insulator openings 143a-143c that allow for manipulation of insulator 142 and corresponding conductor leads 150a-150c. For example, insulator opening 143c extends to one edge of insulator 142 and defines first harness portion 103a and second harness portion 103b that can be manipulated independently from each other. Insulator openings 143a and 143b do not extend to the edge but are used to provide additional flexibility to first harness portion 103a as will now be explained with reference to FIGS. 16B-16F.

FIG. 16B illustrates insulator 142 comprising three insulator openings 143a-143c that divide an insulator into four insulator strips 145a-145d. Each strip may support a separate conductor trace (not shown) when insulator 142 is a part of a harness. It should be noted that insulator 142 is a part of the harness when manipulations shown in FIG. 16C are performed with insulator 142.

FIG. 16C illustrates one end of insulator 142 turned 90° relative to the other end within the X-Y plane. Insulator openings 143a-143c allow insulator 142 to turn and bend without significant out of plane distortions of individual insulator strips 145a-145d. One having ordinary skills in the art would understand that such bending would be difficult without insulator openings because of the flat profile of insulator 142 (small thickness in the Z direction) and the relatively low in-plane flexibility of materials forming insulator 142. Adding insulator openings 143a-143c allows different routing of each of four insulator strips 145a-145d, thereby increasing flexibility and decreasing the out of plane distortion. Furthermore, selecting a particular width and length of each insulator opening allows for specific routing and orientation of each insulator strip. FIGS. 16D and 16E represent cross-sections of insulator strips 145a-145d at different locations of insulator 142. As shown in these figures, insulator strips 145a-145d may be brought closer together and rotated 90° around each of their respective center axes at some point (B-B) in the bend. To achieve this type of orientation, the length of each insulator opening may be different or staggered as, for example, shown in FIG. 16B.

Processing Examples

Figure 17:
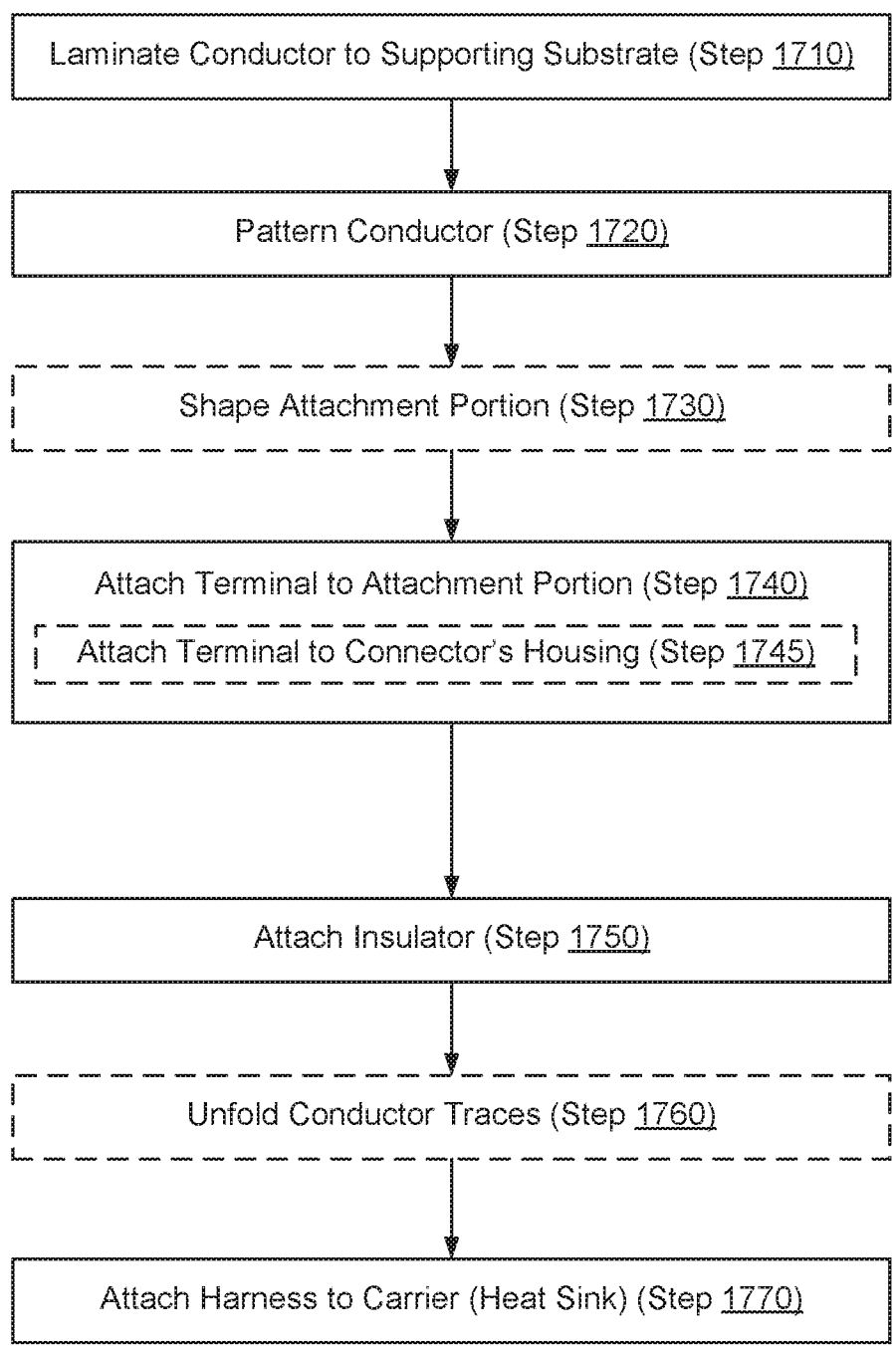
FIG. 17 is a process flowchart corresponding to a method of forming the interconnect circuit, in accordance with some embodiments.

FIG. 17 is a process flowchart corresponding to method 1700 of forming an electrical harness or portions thereof, in accordance with some embodiments. Various examples of the electrical harness are described above. Method 1700 may commence with laminating a conductor to a supporting substrate during step 1710. The conductor may be a metal sheet (e.g., metal foil). Some examples of the conductor are described below with reference to FIGS. 22A-22C.

Method 1700 may proceed with patterning the conductor during step 1720. One or more conductor traces are formed during this step. As described above, a conductor trace may include a conductor lead and a first connecting end. Various examples of conductor traces and their arrangement prior to further processing is described above. Patterning the conductor may involve techniques including, but not limited to, punching, flat bed die cutting, match-metal die cutting, male/female die cutting, rotary die cutting, laser cutting, laser ablation, waterjet cutting, machining, or etching.

Method 1700 may proceed with shaping the attachment portion of conductor during optional step 1730. For example, individual strands may be folded or otherwise rearranged into a shape that has a smaller width-to-thickness ratio than before this step as described above with reference to FIGS. 8A-10C. In some embodiments, after completing step 1730, the width-to-thickness ratio of the attachment portion matches the ratio of the terminal. Furthermore, step 1730 may involve stacking of different conductor traces as described above with reference to FIGS. 2A-4B.

Method 1700 may proceed with attaching a connector to the attachment portion during step 1740. For example, the connector may be crimped and/or welded to the terminal as described above with reference to FIGS. 1A-1B. In another example, a mechanical biasing attachment may be formed between the connector terminal and the attachment portion as described above with reference to FIG. 5.

In some examples, step 1740 also comprises optional step 1745 of attaching one or more terminals to the housing of a connector. For example, the terminals may be inserted into the plastic housing. An example of the assembly formed during step 1745 is shown in FIG. 14C.

Method 1700 may proceed with attaching an insulator to the patterned conductor during step 1750. In some examples, step 1750 is performed after step 1740. Alternatively, step 1750 is performed before step 1740. The insulator attached during step 1750 may be a permanent component of the electrical harness. Some examples of insulator materials are insulator comprises a material selected from the group consisting of polyimide (PI), polyethylene naphthalate (PEN), polyethylene terephthalate (PET), polymethyl methacrylate (PMMA), ethyl vinyl acetate (EVA), polyethylene (PE), polypropylene (PP), polyvinyl fluoride (PVF), polyamide (PA), soldermask, and polyvinyl butyral (PVB). Alternatively, the insulator may comprise an adhesive, such as a pressure-sensitive adhesive, a thermoplastic adhesive, or a thermoset adhesive.

Method 1700 may proceed with unfolding the conductor traces during optional step 1760. Various aspects of this step are described above with reference to FIGS. 14A-14B and 14D-14E. Unfolding of the conductor traces may be performed before or after adding the terminals.

Figure 19B:
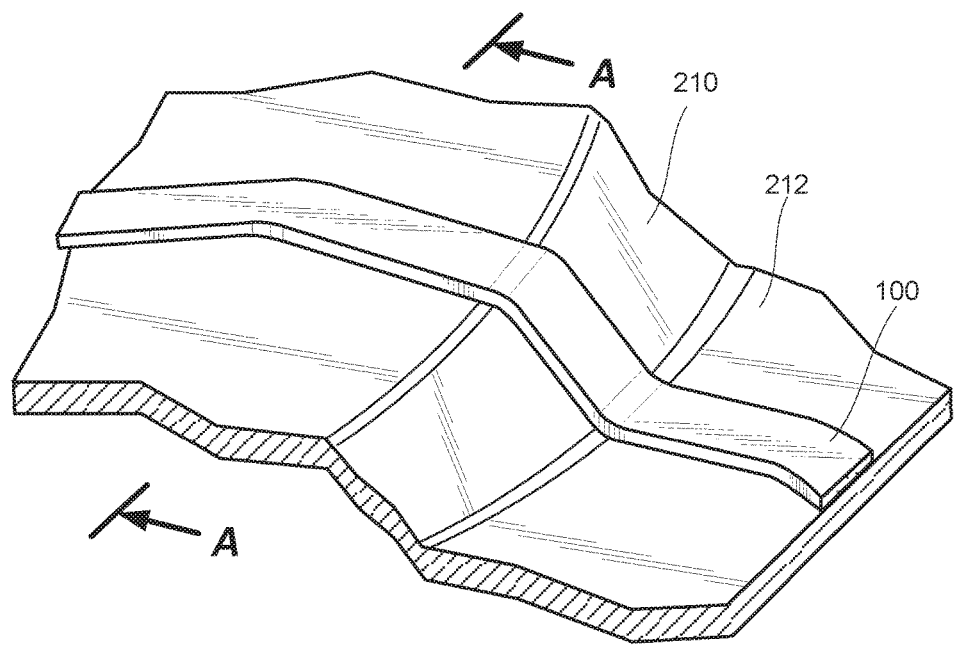
FIGS. 19B and 19C illustrate an electrical harness assembly being substantially conformal to the surface of the door.

Method 1700 may proceed with attaching the harness to a carrier (e.g., heat sink) during optional step 1770. For example, the carrier may be a car door as will be described below with reference to FIGS. 19A-19C.

Jumper Examples

Figure 18A:
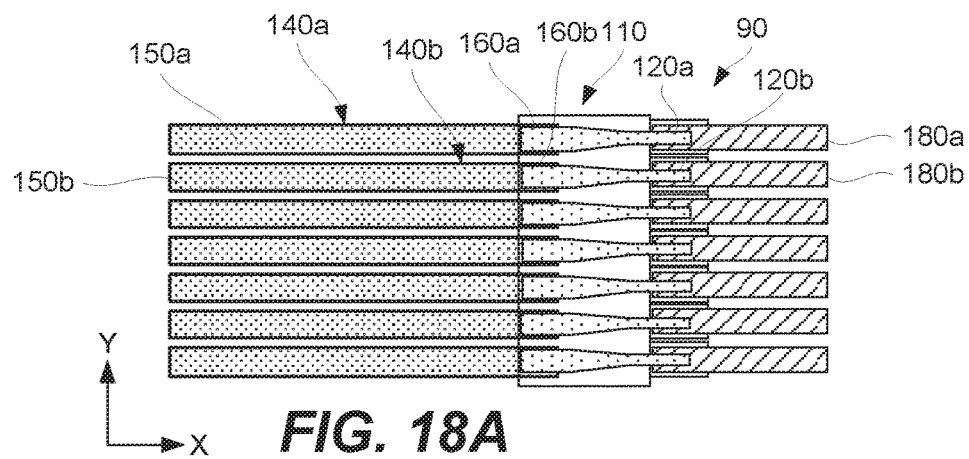
FIGS. 18A-18C illustrate a schematic top view of an electrical harness assembly with a connector assembly with and without jumpers interconnecting different conductor traces of the harness assembly.

In some embodiments, electrical harness assembly 100 further comprises second conductor trace 140b, which in turn comprises second conductor lead 150b and second connecting end 160b. This example is schematically shown in FIG. 18A. The thickness of second conductor trace 140b and the thickness of first conductor trace 140a may be approximately equal (e.g., within 10% or even within 5%, or even identical). For example, first conductor trace 140a and second conductor trace 140b may be formed from the same foil sheet. Furthermore, first conductor lead 150a and second conductor lead 150b are formed from the same material. Second conductor trace 140b and first conductor trace 140a may not contact each other. For example, second conductor trace 140b and first conductor trace 140a may be separated by a gap.

Figure 18B:
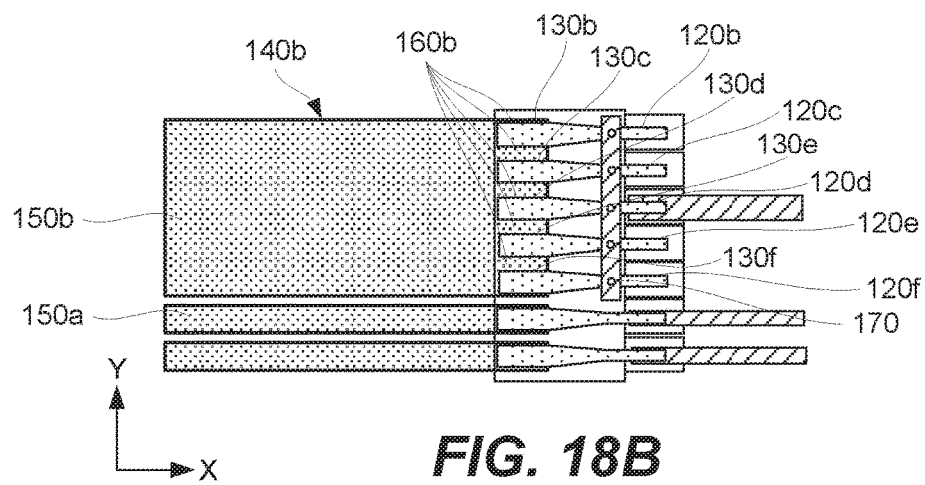

In some embodiments, second connecting end 160b of second conductor trace 140b is electrically coupled to multiple connecting portions of connector 110. For example, FIG. 18B illustrates second connecting end 160b being electrically coupled to five connecting portions 130b-130f of connector 110. As such, making an electrical connection to any one of corresponding contact interface 120b-120f will result in an electrical connection to second connecting end 160b. In some embodiments, the multiple connecting portions may be interconnected by one or more jumpers 170 as, for example, schematically shown in FIGS. 18B-18D. Jumpers 170 allow current balancing to be achieved within connector 110 such that a relatively constant current density can be maintained across the cross-section of second connecting end 160b, thereby allowing the use of thinner materials for second connecting end 160b and second conductor trace 140b.

Figures 18C, 18D:
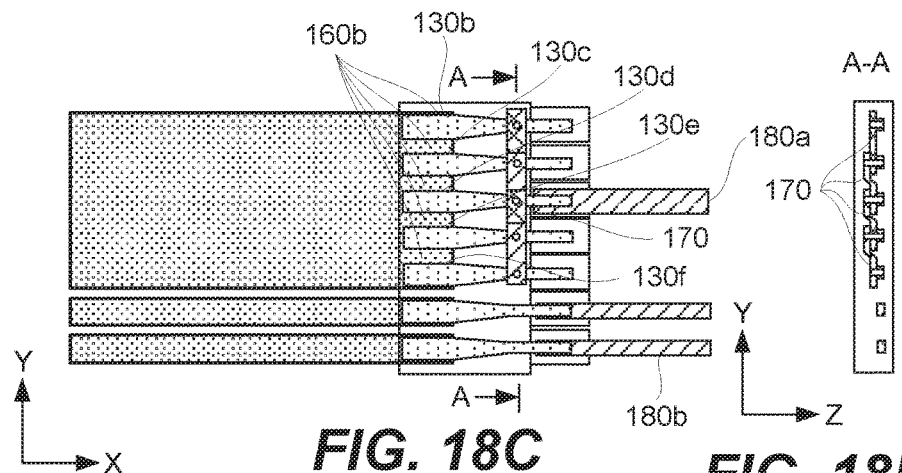
FIG. 18D illustrates a schematic cross-section view of the connector assembly shown in FIG. 18C showing arrangement of multiple jumpers interconnecting different conductor traces of the harness assembly.

Second conductor trace 140b may have a larger current carrying capability than first conductor trace 140a. More specifically, second conductor trace 140b may be wider than first conductor trace 140a as, for example, shown in FIG. 18B. To accommodate this variation in trace width, connecting portions 130a-130f may comprise a top-down crimp connector such as a zero-insertion force (ZIF) connector, for example. Similarly, connector 110 may be designed to accommodate wires 180a, 180b of varying diameter, as shown in FIG. 18B-18C. Thus, connector 110 can interconnect conductor traces 140a, 140b of varying width to wires 180a, 180b of varying diameter with minimal current crowding and/or joule heating effects in either element.

Car Doors with Flat Harnesses

FIG. 19A illustrates car door assembly 200 comprising car door 210 and electrical harness assembly 100, in accordance with some embodiments. Electrical harness assembly 100 may be attached to and mechanically supported by car door 210. For example, electrical harness assembly 100, which is flat, may be adhered to car door 210. Furthermore, in this example, electrical harness assembly 100 may be in thermal communication with car door 210. More specifically, each of conductor leads 150 (hidden under the insulator in FIG. 19A) of flat electrical harness assembly 100 may be in thermal communication with car door 210. This thermal communication is used for heat dissipation from conductor leads 150 while passing electrical currents through conductor leads 150. More specifically, this thermal communication allows using conductor leads 150 with smaller (e.g., 30-90% smaller) cross-sectional areas than those in conventional harnesses, which utilize round wires with minimal thermal communication to car doors or other components of a vehicle. Car door 210 provides a large thermal mass for heat dissipation from conductor leads 150 when conductor leads 150 heat up while passing electrical currents.

Electrical harness assembly 100 may comprise one or more connectors (e.g., connectors 110a-110c shown in FIG. 19A) for connecting to electrical devices 220 of car door assembly 200 and outside of car door assembly 200. Some examples of electrical devices 220 include but are not limited to speakers, lights, door lock, window regulators, power mirrors, and the like. Connections between conductor leads 150 and connectors 110a-110c of electrical harness assembly 100 are described above. While the above description shows that electrical harness assembly 100 is a part of car door assembly 200, electrical harness assembly 100 may be used for other applications as well, e.g., in which thermal sinks are available and can be thermally coupled to electrical harness assembly 100. For example, electrical harness assembly 100 may be used for various appliances (e.g., refrigerators, washer/driers, heating, ventilation, and air conditioning).

Reducing the cross-sectional area of conductor leads 150 corresponds to a reduction in weight of conductor leads 150. For example, many modern cars utilize 1,000-4,000 meters of electrical cables with a total weight of up to 50 kilograms and even up to 100 kilograms. Any reduction in weight helps with fuel economy, car handling, and cost savings.

Furthermore, a combination of the smaller cross-sectional area and of the flat profile of electrical harness assembly 100 allows a substantial reduction in the thickness of electrical harness assembly 100. Specifically, the contribution by electrical harness assembly 100 to the thickness of car door assembly 200 is reduced. As such, car door assembly 200 may be made thinner with electrical harness assembly 100 described herein than with a conventional round-wire bundled harness.

For example, comparing round wires to conductor leads 150, which are flat but have the same cross-sectional area as the round wires yet have a thickness-to-width ratio of 1:10, the reduction in thickness is about 62%; i.e., the thickness of conductor leads 150 is about 38% of the thickness of round wires. Furthermore, the cross-sectional area of conductor leads 150 may be further reduced in comparison to the conductor leads 150 due to the improved heat dissipation of conductor leads 150 to the environment, as described above. The cross-sectional area reduction further reduces the thickness of conductor leads 150. The overall thickness reduction allows increasing the interior space of a car or any other vehicle or machine. In some examples, this thickness reduction allows feeding conductor leads 150 through smaller gaps that may not be suitable for feeding round wires rated for the same current.

As noted above, electrical harness assembly 100 may be attached to surface 212 of car door 210. Furthermore, electrical harness assembly 100 may follow the profile of surface 212. In other words, electrical harness assembly 100 may be substantially conformal surface 212 as, for example, schematically shown in FIGS. 19A and 19B. More specifically, electrical harness assembly 100 may be conformal to surface 212 over at least 50% of the area of electrical harness assembly 100 or at least 75% of the area, or even at least 50% of the area. This conformality ensures that all parts of electrical harness assembly 100 are in thermal communication with car door 210.

Figure 19C:
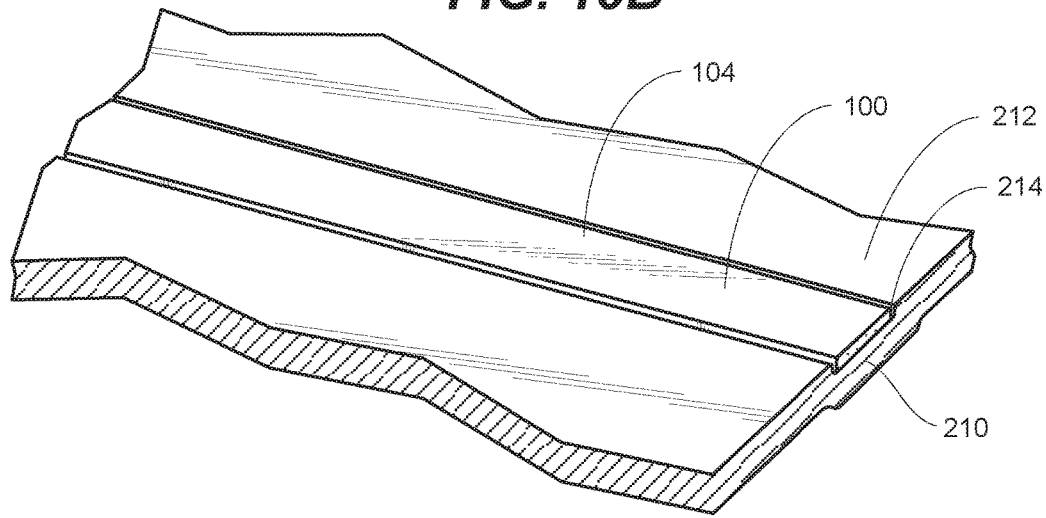

In some embodiments, surface 212 of car door 210 may have indent 214 to accommodate electrical harness assembly 100 as, for example, schematically shown in FIG. 19C. The depth of indent 214 may be substantially the same as the thickness of electrical harness assembly 100 such that top surface 104 of electrical harness assembly 100 and a portion of surface 212 surrounding indent 214 are substantially coplanar. Alternatively, the indent may be shallower and a portion of electrical harness assembly 100 may protrude above the portion of surface 212 surrounding indent 214.

Electrical harness assembly 100 may comprise first insulator 142 and second insulator 144 such that conductor lead 150 is positioned between first insulator 142 and second insulator 144. FIG. 20 is a schematic illustration of first insulator 142, conductor lead 150, and second insulator 144 disposed on car door 210. First insulator 142 may comprise an adhesive layer that adheres electrical harness assembly 100 to car door 210.

In some embodiments, first insulator 142 is or comprises a thermally conductive mounting adhesive. This adhesive may have a thermal conductivity of least about 0.2 W/mK (e.g., about 0.7 W/mK) or even at least about 1.0 W/mK. This level of thermal conductivity may be obtained in an inorganic particle-filled dielectric film or in a thermally conductive PSA film, for example.

Other examples of first insulator 142 include but are not limited to polyimide (PI), polyethylene naphthalate (PEN), polyethylene terephthalate (PET), polymethyl methacrylate (PMMA), ethyl vinyl acetate (EVA), polyethylene (PE), polypropylene (PP), polyvinyl fluoride (PVF), polyamide (PA), soldermask, or polyvinyl butyral (PVB). The composition and thickness of first insulator 142 may be chosen to maximize heat dissipation through first insulator 142, prevent dielectric breakdown to the surrounding environment, act as a sufficient mechanical barrier to air and moisture, and minimize distortion of features of conductor leads 120. In some embodiments, the thickness and composition of first insulator 142 (and its corresponding adhesive layer, should one be present) is chosen to minimize the absorptive and reflective loss of high frequency signals transmitted by the flexible circuit, as well as to provide an impedance match with interfacing electrical components.

The thickness of first insulator 142 may be between 1 micrometer and 500 micrometers or, more specifically, between 10 micrometers and 125 micrometers. In some embodiments, first insulator 142 includes an adhesive layer on the side facing car door 210. Some examples of the adhesive layer include, but are not limited to polyolefin adhesives, polyester adhesives, polyimide adhesives, acrylics, epoxies, cross-linking adhesives, PSAs, and/or thermoplastic adhesives. Optionally, the adhesive layer may be filled with thermally conductive, electrically insulating particles (e.g., alumina) to facilitate heat transfer through the adhesive material.

The material composition of second insulator 144 may be the same or different as the material composition of first insulator 142. For example, first insulator 142 may be made from a material which is more heat conductive that the material of second insulator 144. At the same time, second insulator 144 may be made from a material that has better mechanical properties than first insulator 142 to externally protect conductor lead 150 from damage once the harness is applied to car door 210 and/or to support conductor lead 150 and other components of electrical harness assembly 100 before harness is applied to car door 210.

The thickness of second insulator 144 may be the same or different as the thickness of first insulator 142. For example, one of the insulators (e.g., second insulator 144) may be used as a primary structural support and may be thicker or made from a mechanically stronger material than the other insulator. At the same time, first insulator 142 may be thinner to ensure heat transfer between conductor lead 150 and car door 210.

First insulator 142 and second insulator 144 may be continuous sheets without any openings. First insulator 142 and second insulator 144 may extend an entire length of conductor lead 150 while allowing connecting end 160 to extend beyond first insulator 142 and second insulator 144. Alternatively, in some embodiments, second insulator 144 may extend underneath and provide support to connecting end 160 while first insulator 142 may leave connecting end 160 exposed, thus allowing access to a first surface of connecting end 160. In some embodiments, first insulator 142 and second insulator 144 may be sealed against an insulating enclosure of connector 110.

For purposes of this disclosure and unless otherwise stated, the term "insulator" refers to a structure having an electrical conductivity of less than 10 S/cm. The term "conductor" refers to a structure having an electrical conductivity of at least about 10,000 S/cm. The term "thermal conductor" refers to a structure having a thermal conductivity of at least about 0.2 W/mK. Structures with a thermal conductivity of less than 0.1 W/mK may be referred to as "thermal insulators." It should be noted that a thermal conductor may be also an electrical conductor but it does not have to be. For example, a class of electrically insulating materials, such as diamond and aluminum nitride, are good thermal conductors. The materials may be used, for example, as a surface coating.

Electrical conductors are typically thermally conductive. The term "electro-thermal conductor" refers to a structure having an electrical conductivity of greater than 10,000 S/cm and a thermal conductivity of greater than 10 W/mK. The term "electrically isolated" may refer to a lack of a physical connection between two electrical conductors, either directly or through one or more other electrical conductors.

Figure 21A:
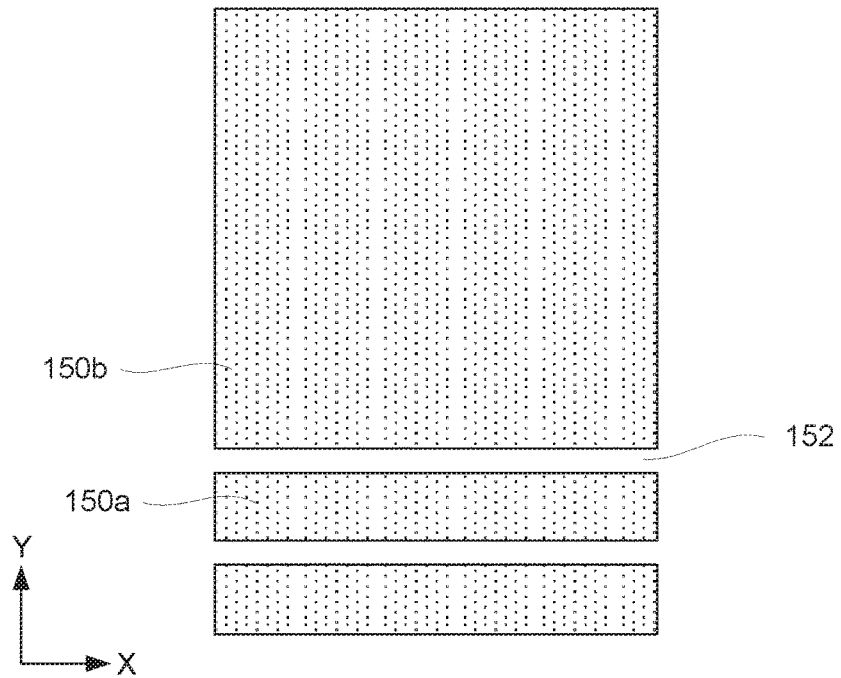
FIGS. 21A and 21B are schematic top and cross-section views showing the widths of gaps between two-conductor leads.
Figure 21B:
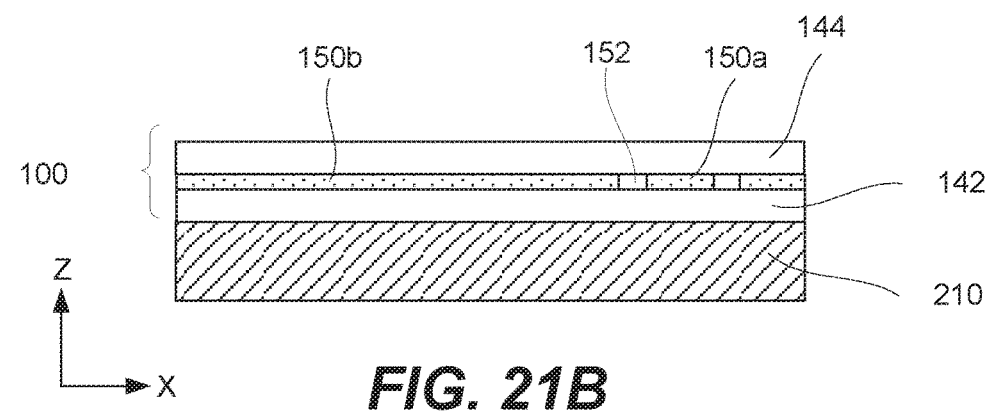

Referring to FIGS. 21A and 21B, the width of gap 152 between first conductor lead 150a and second conductor lead 150b may be between about 100 micrometers and 3 millimeters or, more specifically, between about 250 micrometers and 1 millimeter. The aspect ratio of gap 152, as defined by the width of gap 152 divided by the conductor thickness (which is effective the depth of gap 152), may less than about 10 or, more specifically, less than about 5 or even less than about 2. Gap 152 may be empty or filled with an adhesive.

First insulator 142 and, in some embodiments, second insulator 144 maintain the orientation of first conductor lead 150a and second conductor lead 150b relative to each other. This feature may be used to maintain first conductor lead 150a electrically insulated from second conductor lead 150b.

Examples of Sublayers of Electro-Thermal Conductors

Figure 22A:
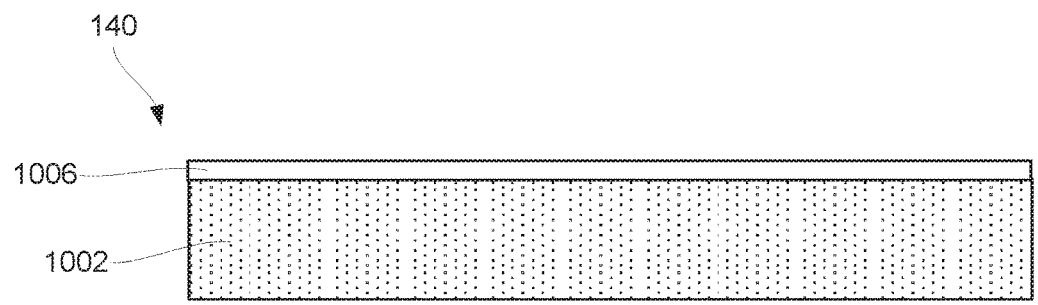
FIGS. 22A and 22B are schematic cross-section views of a conductor trace showing a base sublayer and two examples of a surface sublayer.
Figure 22B:
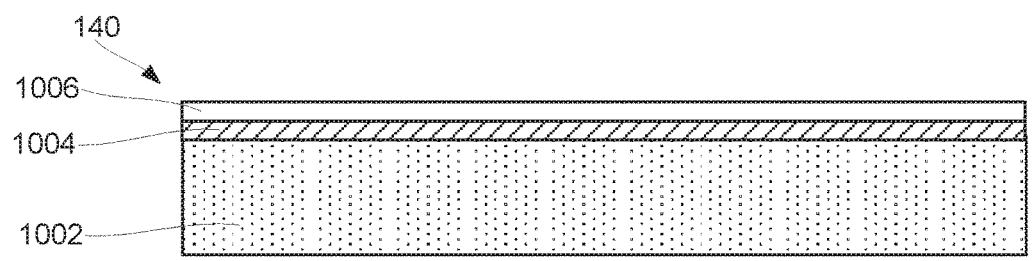

In some embodiments, conductor trace 140 comprises base sublayer 1002 and surface sublayer 1006 as, is shown in FIG. 22A, for example. Surface sublayer 1006 may have a different composition than base sublayer 1002. First insulator 142 or second insulator 144 may be laminated over surface sublayer 1006. More specifically, at least a portion of surface sublayer 1006 may directly interface first insulator 142 or second insulator 144 (or an adhesive used for attaching first insulator 142 or second insulator 144 to conductor trace 140). In these examples, surface sublayer 1006 is disposed between base sublayer 1002 and first insulator 142 or second insulator 144. Surface sublayer 1006 may be specifically selected to improve adhesion of first insulator 142 or second insulator 144 to conductor trace 140, and/or other purposes as described below.

Base sublayer 1002 may comprise a metal selected from a group consisting of aluminum, titanium, nickel, copper, steel, and alloys comprising these metals. The material of base sublayer 1002 may be selected to achieve desired electrical and thermal conductivities of overall conductor trace 140 while maintaining minimal cost.

Surface sublayer 1006 may comprise a metal selected from the group consisting of tin, lead, zinc, nickel, silver, palladium, platinum, gold, indium, tungsten, molybdenum, chrome, copper, alloys thereof, organic solderability preservative (OSP), or other electrically conductive materials. The material of surface sublayer 1006 may be selected to protect base sublayer 1002 from oxidation, improve surface conductivity when forming electrical and/or thermal contact to device, improve adhesion to conductor trace 140, and/or other purposes. Furthermore, in some embodiments, the addition of a coating of OSP on top of surface sublayer 1006 may help prevent surface sublayer 1006 itself from oxidizing over time.

For example, aluminum may be used for base sublayer 1002. While aluminum has a good thermal and electrical conductivity, it forms a surface oxide when exposed to air. Aluminum oxide has poor electrical conductivity and may not be desirable at the interface between conductor trace 140 and, for example, connection portion 130 of connector 110. In addition, in the absence of a suitable surface sublayer, achieving good, uniform adhesion between the surface oxide of aluminum and many adhesive layers may be challenging. Therefore, coating aluminum with one of tin, lead, zinc, nickel, silver, palladium, platinum, gold, indium, tungsten, molybdenum, chrome, or copper before aluminum oxide is formed mitigates this problem and allows using aluminum as base sublayer 1002 without compromising electrical conductivity or adhesion between conductor trace 140 and other components of electrical harness assembly 100.

Surface sublayer 1006 may have a thickness of between about 0.01 micrometers and 10 micrometers or, more specifically, between about 0.1 micrometers and 1 micrometer. For comparison, thickness of base sublayer 1002 may be between about 10 micrometers and 1000 micrometers or, more specifically, between about 100 micrometers and 500 micrometers. As such, base sublayer 1002 may represent at least about 90% or, more specifically, at least about 95% or even at least about 99% of conductor trace 140 by volume.

While some of surface sublayer 1006 may be laminated to an insulator, a portion of surface sublayer 1006 may remain exposed. This portion may be used to form electrical and/or thermal contacts between conductor trace 140 to other components.

In some embodiments, conductor trace 140 further comprises one or more intermediate sublayers 1004 disposed between base sublayer 1002 and surface sublayer 1006. Intermediate sublayer 1004 has a different composition than base sublayer 1002 and surface sublayer 1006. In some embodiments, the one or more intermediate sublayers 1004 may help prevent intermetallic formation between base sublayer 1002 and surface sublayer 1006. For example, intermediate sublayer 1004 may comprise a metal selected from a group consisting of chromium, titanium, nickel, vanadium, zinc, and copper.

In some embodiments, conductor trace 140 may comprise rolled metal foil. In contrast to the vertical grain structure associated with electrodeposited foil and/or plated metal, the horizontally-elongated grain structure of rolled metal foil may help increase the resistance to crack propagation in conductor trace 140 under cyclical loading conditions. This may help increase the fatigue life of electrical harness assembly 100.

Figure 22C:
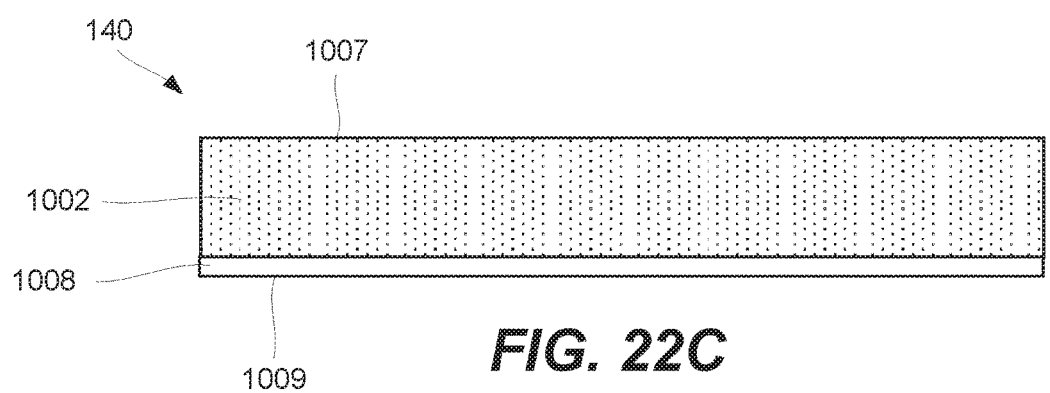
FIG. 22C is a schematic cross-section view of a conductor trace showing a base sublayer and an electrically insulating coating.

In some embodiments, conductor trace 140 comprises electrically insulating coating 1008 forming surface 1009 of conductor trace 140 opposite of device-side surface 1007 as, for example, shown in FIG. 22C. At least a portion of this surface 1009 may remain exposed in electrical harness assembly 100 and may be used for heat removal from electrical harness assembly 100. In some embodiments, the entire surface 1009 remains exposed in electrical harness assembly 100. Insulating coating 1008 may be selected for relatively high thermal conductivity and relatively high electrical resistivity and may comprise a material selected from a group consisting of silicon dioxide, silicon nitride, anodized alumina, aluminum oxide, boron nitride, aluminum nitride, diamond, and silicon carbide. Alternatively, insulating coating may comprise a composite material such as a polymer matrix loaded with thermally conductive, electrically insulating inorganic particles.

In some embodiments, conductor trace 140 is solderable. When conductor trace 140 includes aluminum, the aluminum may be positioned as base sublayer 1002, while surface sublayer 1006 may be made from a material having a melting temperature that is above the melting temperature of the solder. Otherwise, if surface sublayer 1006 melts during circuit bonding, oxygen may penetrate through surface sublayer 1006 and oxidize aluminum within base sublayer 1002. This in turn may reduce the conductivity at the interface of the two sublayers and potentially cause a loss of mechanical adhesion. Hence, for many solders which are applied at temperatures ranging from 150-300 C, surface sublayer 1006 may be formed from zinc, silver, palladium, platinum, copper, nickel, chrome, tungsten, molybdenum, or gold.

Multi-Harness Handling Examples

Figure 23:
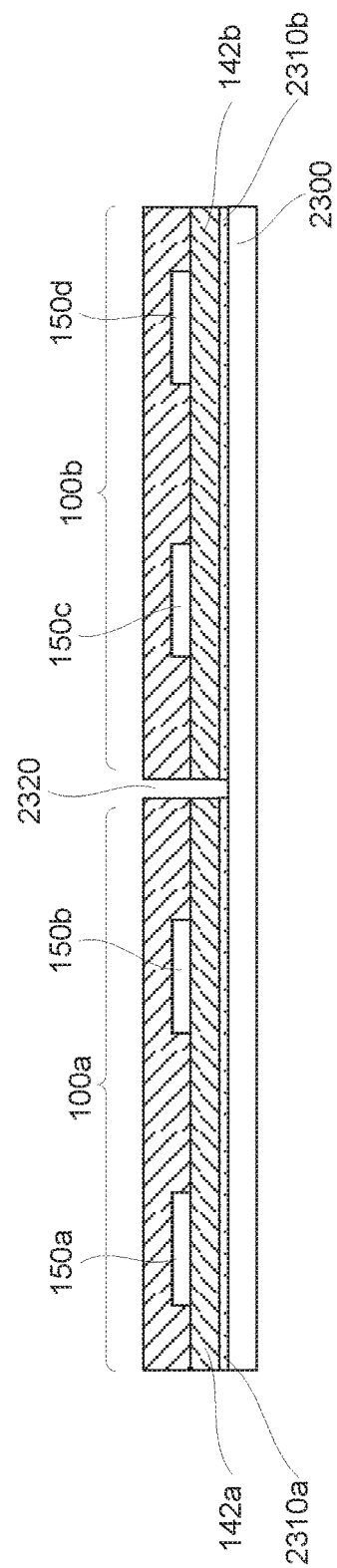
FIG. 23 illustrates an example of two harnesses supported on the same carrier film.

FIG. 23 illustrates an example of electrical harness assembly 100*a* and electrical harness assembly 100*b* supported on the same carrier film 2300. This example simplifies handling of electrical harness assembly 100*a* and electrical harness assembly 100*b* during their production, storage, and initial application. For example, electrical connections can be formed to multiple conductor leads 150*a*-150*d* prior to separating electrical harness assembly 100*a* and electrical harness assembly 100*b* from carrier film 2300. Once electrical harness assembly 100*a* is removed from carrier film 2300, adhesive layer 2310*a* may be used for attaching electrical harness assembly 100*a* to other support structures (e.g., heat sinks). Cut opening 2320 may be positioned between electrical harness assembly 100*a* and electrical harness assembly 100*b* to allow independent removal of each harness from carrier film 2300. In some examples, first insulator portion 142*a* and first adhesive layer 2310*a* may optionally be combined into a single layer or be separate layers. Likewise, second insulator portion 142*b* and second adhesive layer 2310*b* may optionally be combined into a single layer or be separate layers.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. An electrical harness assembly comprising:
a first conductor trace, extending along an axis of the electrical harness assembly and comprising a first conductor lead and a first connecting end, monolithic with the first conductor lead;
a second conductor trace, extending along the axis of the electrical harness assembly and comprising a second conductor lead and a second connecting end, monolithic with the second conductor lead,
a third conductor trace, extending along the axis of the electrical harness assembly and comprising a third conductor lead and a third connecting end, monolithic with the third conductor lead; and
an insulator, comprising a first elongated opening, extending along the axis of the electrical harness assembly and partially dividing the insulator into a first insulator strip and a second insulator strip and further comprising a second elongated opening, extending along the axis and partially dividing the insulator into a third insulator strip and the second insulator strip, wherein:
the first conductor lead is laminated to the first insulator strip and away from the first elongated opening;

the second conductor lead is laminated to the second insulator strip and away from the first elongated opening;
the third conductor lead is laminated to the third insulator strip and away from the second elongated opening;
the second conductor lead is positioned away from the second elongated opening;
the first elongated opening has a closed shape such that the first insulator strip and the second insulator strip are joined together and monolithic at both ends of the first elongated opening;
the second elongated opening has a closed shape such that the second insulator strip and the third insulator strip are joined together and monolithic at both ends of the second elongated opening; and
the first elongated opening and the second elongated opening have different lengths along the axis.

2. The electrical harness assembly of claim 1, further comprising a first adhesive layer portion and a second adhesive layer portion, separated by an adhesive opening, wherein: the first conductor lead is disposed between the first adhesive layer portion and the first insulator strip; the second conductor lead is disposed between the second adhesive layer portion and the second insulator strip.

3. The electrical harness assembly of claim 2, wherein the adhesive opening coincides with the first elongated opening of the insulator.

4. The electrical harness assembly of claim 2, wherein each of the first adhesive layer portion and the second adhesive layer portion is a pressure-sensitive adhesive (PSA) film.

5. The electrical harness assembly of claim 1, wherein each of the first insulator strip, the first conductor lead, the second insulator strip, and the second conductor lead has a rectangular cross-section within a cross-sectional plane perpendicular to the axis.

6. The electrical harness assembly of claim 5, wherein a width of the first insulator strip is smaller than a thickness of the first insulator strip within a cross-sectional plane perpendicular to the axis, the thickness defined by stacking of the first insulator strip and the first conductor lead.

7. The electrical harness assembly of claim 1, wherein the first elongated opening enhances in-plane flexibility of the electrical harness assembly.

8. The electrical harness assembly of claim 7, wherein the first elongated opening allows portions of the first insulator strip and the second insulator strip, surrounding the first elongated opening and positioned away from ends of the first elongated opening, to move relative to each other, during in-plane bending of the electrical harness assembly.

9. The electrical harness assembly of claim 8, wherein the first elongated opening allows the portions of the first insulator strip and the second insulator strip, surrounding the first elongated opening and positioned away from the ends of the first elongated opening, to form a stack, during the in-plane bending of the electrical harness assembly.

10. The electrical harness assembly of claim 8, wherein the first elongated opening allows the portions of the first insulator strip and the second insulator strip, surrounding the first elongated opening and positioned away from the ends of the first elongated opening, to twist relative to portions of the first insulator strip and the second insulator strip, at the ends of the first elongated opening, during the in-plane bending of the electrical harness assembly.

11. The electrical harness assembly of claim 8, wherein the first elongated opening allows the electrical harness assembly to maintain a thickness less than or equal to a width of the first insulator strip or a width of the second insulator strip, during the in-plane bending of the electrical harness assembly.

12. The electrical harness assembly of claim 1, further comprising a connector, wherein: the connector comprises a first connecting portion and a second connecting portion; the first connecting portion of the connector is electrically coupled to the first connecting end of the first conductor trace; and the second connecting portion of the connector is electrically coupled to the second connecting end of the second conductor trace.

13. The electrical harness assembly of claim 12, wherein the first connecting end is positioned above the second connecting end such that a projection of the first connecting end is a direction perpendicular to a width of the first connecting end is centered relative to the second connecting end.

14. The electrical harness assembly of claim 12, wherein: the connector comprises a third connecting portion, electrically coupled to the first connecting end of the first conductor trace; and the connector comprises a jumper, electrically coupling the first connecting portion and the third connecting portion.

15. A method of arranging an electrical harness assembly having an axis, the method comprising: providing the electrical harness assembly comprising: a first integrated portion, a slit portion, and a second integrated portion, such that the slit portion is disposed between the first integrated portion and the second integrated portion along the axis; a first conductor trace, comprising a first conductor lead and a first connecting end, monolithic with the first conductor lead, extending along the axis through the first integrated portion, the slit portion, and the second integrated portion; a second conductor trace, extending along the axis and comprising a second conductor lead and a second connecting end, monolithic with the second conductor lead, extending along the axis through the first integrated portion, the slit portion, and the second integrated portion; an insulator, comprising a first elongated opening, extending along the axis through the slit portion and between the first integrated portion and the second integrated portion and partially, dividing the insulator into a first insulator strip and a second insulator strip, and having a closed shape such that the first insulator strip and the second insulator strip are joined together at both ends of the first elongated opening in the first integrated portion and the second integrated portion; and laminating the first integrated portion and the second integrated portion to a surface of a heat sink, such that the first integrated portion is turned related to the second integrated portion around a turn axis perpendicular to the surface of the heat sink thereby forming a bend radius, wherein, after laminating, the first insulator strip and the second insulator strip have different orientation relative to each other along the bend radius in the slit portion, wherein the electrical harness assembly further comprises a third conductor trace, extending along the axis of the electrical harness assembly and comprising a third conductor lead and a third connecting end, monolithic with the third conductor lead, extending along the axis through the first integrated portion, the slit portion, and the second integrated portion, wherein: the insulator comprises a second elongated opening, extending along the axis of the electrical harness assembly through the slit portion and between the first integrated portion and the second integrated portion and partially dividing the insulator into a third insulator strip and the second insulator strip; the third conductor lead is laminated to the third insulator strip and is positioned away from the second elongated opening; the second conductor lead is positioned away from the second elongated opening; the second elongated opening has a closed shape such that the second insulator strip and the third insulator strip are joined together at both ends of the second elongated opening in the first integrated portion and the second integrated; and the first elongated opening and the second elongated opening have different lengths along the axis.

16. The method of claim 15, wherein, after laminating, the first insulator strip and the second insulator strip have different twist angles relative to the surface of the heat sink along the bend radius in the slit portion.

17. The method of claim 15, wherein, after laminating, the first insulator strip and the second insulator strip are stacked in a direction parallel to the surface of the heat sink along the bend radius in the slit portion.

18. The method of claim 15, wherein the lengths the first elongated opening and the second elongated opening depend on the bend radius.

* * * * *